United States Patent
Yamazaki et al.

(10) Patent No.: US 9,601,636 B2
(45) Date of Patent: *Mar. 21, 2017

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Shunpei Yamazaki, Setagaya (JP); Tatsuya Honda, Isehara (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/066,348

(22) Filed: Mar. 10, 2016

(65) Prior Publication Data

US 2016/0190333 A1  Jun. 30, 2016

Related U.S. Application Data

(63) Continuation of application No. 14/540,365, filed on Nov. 13, 2014, now Pat. No. 9,287,409, which is a
(Continued)

(30) Foreign Application Priority Data

Jun. 17, 2011 (JP) .................. 2011-135561

(51) Int. Cl.
*H01L 29/786* (2006.01)
*H01L 29/778* (2006.01)
(Continued)

(52) U.S. Cl.
CPC ........ *H01L 29/7869* (2013.01); *H01L 29/045* (2013.01); *H01L 29/24* (2013.01);
(Continued)

(58) Field of Classification Search
CPC . H01L 21/775; H01L 27/12; H01L 29/66765; H01L 29/4908
See application file for complete search history.

(56) References Cited

U.S. PATENT DOCUMENTS 5,528,032 A  6/1996 Uchiyama
5,731,856 A  3/1998 Kim et al.
(Continued)

FOREIGN PATENT DOCUMENTS

EP  1737044 A  12/2006
EP  2226847 A  9/2010
(Continued)

OTHER PUBLICATIONS

Ono.M et al., "Novel High Performance IGZO-TFT with High Mobility over 40 cm2/Vs and High Photostability Incorporated Oxygen Diffusion", IDW '11 : Proceedings of the 18th International Display Workshops, Dec. 7, 2011, pp. 1689-1690.
(Continued)

*Primary Examiner* — Quoc Hoang
(74) *Attorney, Agent, or Firm* — Robinson Intellectual Property Law Office; Eric J. Robinson

(57) ABSTRACT

One object of the present invention is to provide a structure of a transistor including an oxide semiconductor in a channel formation region in which the threshold voltage of electric characteristics of the transistor can be positive, which is a so-called normally-off switching element, and a manufacturing method thereof. A second oxide semiconductor layer which has greater electron affinity and a smaller energy gap than a first oxide semiconductor layer is formed over the first oxide semiconductor layer. Further, a third oxide semiconductor layer is formed to cover side surfaces and a top
(Continued)

surface of the second oxide semiconductor layer, that is, the third oxide semiconductor layer covers the second oxide semiconductor layer.

20 Claims, 10 Drawing Sheets

Related U.S. Application Data continuation of application No. 13/495,313, filed on Jun. 13, 2012, now Pat. No. 8,890,152.

(51) Int. Cl.
*H01L 29/04* (2006.01)
*H01L 29/24* (2006.01)
*H01L 29/267* (2006.01)

(52) U.S. Cl.
CPC .... *H01L 29/7782* (2013.01); *H01L 29/78609* (2013.01); *H01L 29/78696* (2013.01); *H01L 29/267* (2013.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,838,308 | B2 | 1/2005 | Haga |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,732,819 | B2 | 6/2010 | Akimoto et al. |
| 7,977,169 | B2 | 7/2011 | Hirao et al. |
| 7,994,500 | B2 | 8/2011 | Kim et al. |
| 8,058,645 | B2 | 11/2011 | Jeong et al. |
| 8,148,779 | B2 | 4/2012 | Jeong et al. |
| 8,188,480 | B2 | 5/2012 | Itai |
| 8,193,045 | B2 | 6/2012 | Omura et al. |
| 8,202,365 | B2 | 6/2012 | Umeda et al. |
| 8,203,143 | B2 | 6/2012 | Imai |
| 8,253,134 | B2 | 8/2012 | Kim et al. |
| 8,319,905 | B2 | 11/2012 | Yoon et al. |
| 8,344,373 | B2 | 1/2013 | Sato et al. |
| 8,362,478 | B2 | 1/2013 | Yamazaki et al. |
| 8,502,221 | B2 | 8/2013 | Yamazaki |
| 8,633,480 | B2 | 1/2014 | Yamazaki et al. |
| 8,748,886 | B2 | 6/2014 | Yamazaki et al. |
| 8,753,548 | B2 | 6/2014 | Yano et al. |
| 8,853,690 | B2 | 10/2014 | Yamazaki et al. |
| 8,871,119 | B2 | 10/2014 | Yano et al. |
| 8,890,152 | B2 * | 11/2014 | Yamazaki ........... H01L 29/7782 257/59 |
| 9,190,528 | B2 | 11/2015 | Yamazaki et al. |
| 9,287,409 | B2 * | 3/2016 | Yamazaki ........... H01L 29/7782 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0006834 | A1 | 1/2010 | Kim et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0320458 | A1 | 12/2010 | Umeda et al. |
| 2010/0320459 | A1 | 12/2010 | Umeda et al. |
| 2011/0140100 | A1 | 6/2011 | Takata et al. |
| 2011/0193083 | A1 | 8/2011 | Kim et al. |
| 2011/0215328 | A1 | 9/2011 | Morosawa et al. |
| 2011/0240990 | A1 | 10/2011 | Yamazaki |
| 2011/0240991 | A1 | 10/2011 | Yamazaki |
| 2011/0240992 | A1 | 10/2011 | Yamazaki |

(56) References Cited

U.S. PATENT DOCUMENTS

| | | |
|---|---|---|
| 2011/0240993 A1 | 10/2011 | Yamazaki |
| 2011/0240994 A1 | 10/2011 | Yamazaki |
| 2011/0240995 A1 | 10/2011 | Yamazaki |
| 2011/0248260 A1 | 10/2011 | Yamazaki |
| 2012/0119205 A1 | 5/2012 | Taniguchi et al. |
| 2012/0319102 A1 | 12/2012 | Yamazaki et al. |
| 2012/0319114 A1 | 12/2012 | Yamazaki et al. |
| 2013/0009209 A1 | 1/2013 | Yamazaki |
| 2014/0131704 A1 | 5/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-129331 A | 5/1993 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2008-140984 A | 6/2008 |
| JP | 2009-170905 A | 7/2009 |
| JP | 2009-231613 A | 10/2009 |
| JP | 2010-016347 A | 1/2010 |
| JP | 2010-040552 A | 2/2010 |
| JP | 4415062 | 2/2010 |
| JP | 2010-067954 A | 3/2010 |
| JP | 2010-177431 A | 8/2010 |
| JP | 4571221 | 10/2010 |
| JP | 2010-267955 A | 11/2010 |
| JP | 2011-119718 A | 6/2011 |
| JP | 2012-160679 A | 8/2012 |
| WO | WO-2004/114391 | 12/2004 |
| WO | WO-2008/133345 | 11/2008 |
| WO | WO-2010/067571 | 6/2010 |
| WO | WO-2011/039853 | 4/2011 |
| WO | WO-2011/055620 | 5/2011 |

OTHER PUBLICATIONS

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 12, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, pr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T at al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

(56) References Cited

OTHER PUBLICATIONS

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Disgest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J at al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size Amoled", AM-FPD '08 Digest of Technical Papers, Jul. 2, 2008, pp. 275-278.

Park.S at al., "Challenge to Future Displays: Transparent AM-OLED Driven by Peald Grown ZnO TFT", IMID '07 Digest, 2007, pp. 1249-1252.

Godo.H at al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T at al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YBFE2O4, and YB2FE3O7 Types of Structures for Compounds in the In2O3 and SC2O3—A2O3—BO Systems [A; Fe, Ga, or Al; B: Mg, Mn, Fe, Cu, or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H at al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A at al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214TH ECS Meeting, 2008, No. 2317, ECS.

(56) References Cited

OTHER PUBLICATIONS

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nakayama et al., "17a-TL-8 Effect of GaO Layer on IGZO-TFT Channel", Extended Abstracts (The 57th Spring Meeting 2010), The Japan Society of Applied Physics and Societies, Mar. 17, 2010, pp. 21-008.

\* cited by examiner

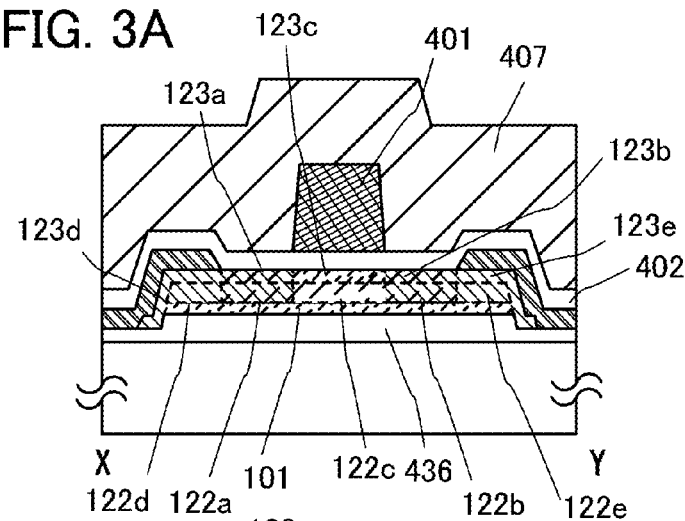
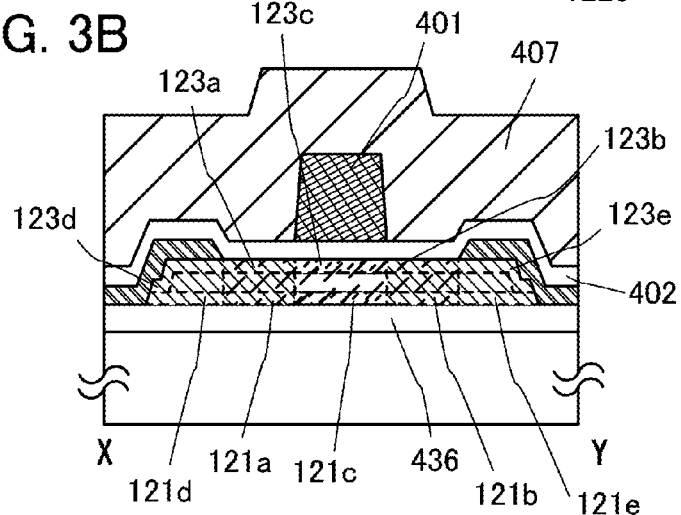
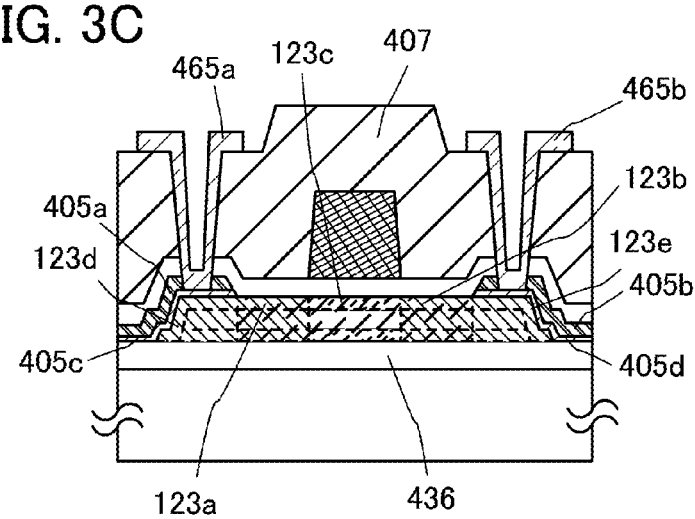

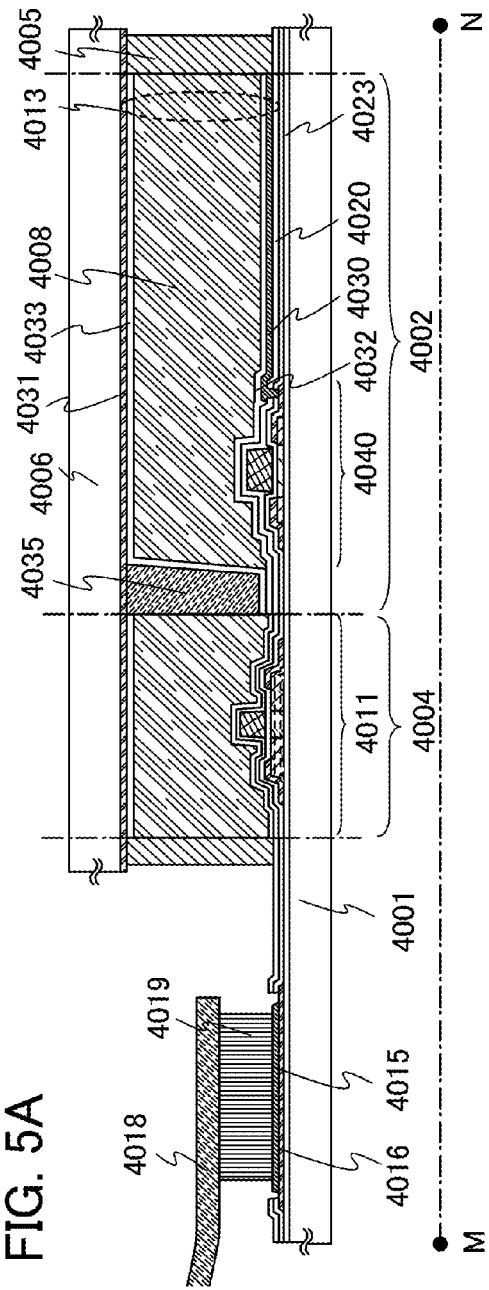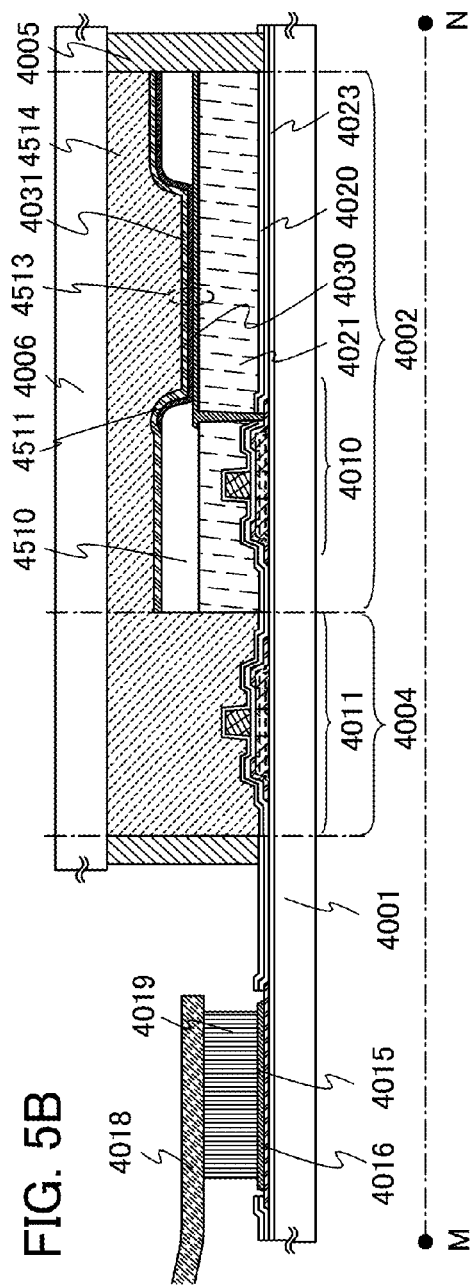

SEMICONDUCTOR DEVICE AND MANUFACTURING METHOD THEREOF

BACKGROUND OF THE INVENTION

1. Field of the Invention

One embodiment of the present invention relates to a semiconductor device including a transistor or a semiconductor device including a circuit which is formed using a transistor. For example, one embodiment of the present invention relates to a semiconductor device including a transistor in which a channel formation region is formed using an oxide semiconductor or a semiconductor device including a circuit which is formed by using such a transistor. For example, the present invention relates to an electronic device which includes, as a component, a semiconductor integrated circuit including an LSI, a CPU, a power device mounted in a power circuit, a memory, a thyristor, a converter, an image sensor, or the like, or a light-emitting display device including a light-emitting element or an electro-optical device typified by a liquid crystal display panel.

In this specification, a semiconductor device generally means a device which can function by utilizing semiconductor characteristics, and an electrooptic device, a semiconductor circuit, and electronic equipment are all semiconductor devices.

2. Description of the Related Art

In recent years, semiconductor devices have been developed to be used as an LSI, a CPU, or a memory. A CPU is an aggregation of semiconductor elements each provided with an electrode which is a connection terminal and includes a semiconductor integrated circuit (including at least a transistor and a memory) separated from a semiconductor wafer.

A semiconductor circuit (IC chip) of an LSI, a CPU, or a memory is mounted on a circuit board (e.g., a printed wiring board) to be used as one of components of a variety of electronic devices.

Further, a technique for manufacturing a transistor or the like by using an oxide semiconductor film for a channel formation region and applying it to a display device has been attracting attention. Examples of such a transistor include a transistor in which zinc oxide (ZnO) is used as an oxide semiconductor film and a transistor in which $InGaO_3(ZnO)_m$ is used as an oxide semiconductor film. A technique for manufacturing such a transistor including an oxide semiconductor film over a light-transmitting substrate and applying it to a switching element or the like of an image display device is disclosed in Patent Documents 1 and 2.

REFERENCE

[Patent Document 1] Japanese Published Patent Application No. 2007-123861

[Patent Document 2] Japanese Published Patent Application No. 2007-096055

SUMMARY OF THE INVENTION

One object of the present invention is to provide a structure of a transistor including an oxide semiconductor in a channel formation region in which the threshold voltage of electric characteristics of the transistor can be positive, which is a so-called normally-off switching element, and a manufacturing method thereof.

It is preferable that a channel be formed at a positive threshold voltage which is as close to 0 V as possible in a transistor. If the threshold voltage of the transistor is negative, the transistor tends to be in a so-called normally-on state, in which current flows between the source electrode and the drain electrode even when the gate voltage is 0 V. For an LSI, a CPU or a memory, electric characteristics of transistors included in a circuit are significant and the electric characteristics affect power consumption of the semiconductor device. In particular, of the electric characteristics of the transistor, the threshold voltage ($V_{th}$) is significant. When the threshold voltage value is negative even when the field effect mobility is high, it is difficult to control as the circuit. Such a transistor in which a channel is formed even at a negative voltage so that a drain current flows is not suitable as a transistor used in an integrated circuit of a semiconductor device.

Further, it is preferable to achieve the characteristics of a transistor close to the normally-off characteristics even when the transistor is not a normally-off transistor depending on the material or the manufacturing condition. It is an object of one embodiment of the present invention to provide a structure for achieving a threshold voltage of a transistor close to zero even when the threshold voltage is negative, that is, even when the transistor is a so-called normally-on transistor, and to provide a manufacturing method thereof.

Further, in order to achieve a semiconductor device having higher performance, one object of the present invention is to provide a structure for improving on-state characteristics of the transistor (e.g., on-state current and field-effect mobility) and for achieving high-speed response and high-speed operation of the semiconductor device and a manufacturing method thereof.

Further, one object of the present invention is to provide a structure for suppressing generation of leakage current (parasitic channel) between a source electrode layer and a drain electrode layer of a transistor. To reduce leakage current of a transistor is important for obtaining a semiconductor device with low power consumption because leakage current of a transistor also affects power consumption.

A transistor is formed using stack of oxide semiconductor layers with different materials so that the on-state characteristics of the transistor are improved. In the structure of the stack of oxide semiconductor layers, specifically, a second oxide semiconductor layer which has greater electron affinity and a smaller energy gap than a first oxide semiconductor layer is formed over the first oxide semiconductor layer. Further, a third oxide semiconductor layer is formed to cover side surfaces and a top surface of the second oxide semiconductor layer, that is, the third oxide semiconductor layer covers the second oxide semiconductor layer. Note the electron affinity and the energy gap of the third oxide semiconductor layer are equivalent those of the first oxide semiconductor layer. Here, electron affinity refers to an energy difference between a vacuum level and a conduction band of an oxide semiconductor.

Specifically, the energy gap of the first oxide semiconductor layer and the energy gap of the third oxide semiconductor layer are larger than or equal to 3 eV, and the energy gap of the second oxide semiconductor layer is smaller than 3 eV. Note that in this specification, the term "energy gap" has the same meaning as "band gap" or "forbidden band".

The periphery of the second oxide semiconductor layer is covered with the first oxide semiconductor layer and the third oxide semiconductor layer, so that an increase in oxygen deficiency of the second oxide semiconductor layer is suppressed and the threshold voltage of the transistor can be close to zero. Further, the second oxide semiconductor layer functions as a buried channel, so that a channel formation region is kept away from the interface between the insulating film and the third oxide semiconductor film. Accordingly, interface scattering of carriers can be reduced, so that a transistor can have high field effect mobility.

One embodiment of the present invention disclosed in this specification is a semiconductor device including a first oxide semiconductor layer, a second oxide semiconductor layer which is provided over the first oxide semiconductor layer, a third oxide semiconductor layer which is provided over the second oxide semiconductor layer to cover side surfaces of the second oxide semiconductor layer, a source electrode layer or a drain electrode layer which is provided over the third oxide semiconductor layer, a gate insulating film which is provided over the source electrode layer or the drain electrode layer, and a gate electrode layer which overlaps with the first oxide semiconductor layer, the second oxide semiconductor layer, and the third oxide semiconductor layer and is provided over the gate insulating film. The second oxide semiconductor layer has greater electron affinity than the first oxide semiconductor layer or the third oxide semiconductor layer. Alternatively, the second oxide semiconductor layer has a smaller energy gap than the first oxide semiconductor layer or the third oxide semiconductor layer.

In the above structure, the first oxide semiconductor layer and the second oxide semiconductor layer can be formed using the same mask, and the third oxide semiconductor layer overlaps with the second oxide semiconductor layer and has a larger area than the second oxide semiconductor layer to cover the second oxide semiconductor layer. One embodiment with such a structure is a semiconductor device including a first oxide semiconductor layer, a second oxide semiconductor layer which is provided over the first oxide semiconductor layer, a third oxide semiconductor layer which is provided over the second oxide semiconductor layer to cover side surfaces of the first oxide semiconductor layer and side surfaces of the second oxide semiconductor layer, a source electrode layer or a drain electrode layer which is provided over the third oxide semiconductor layer, a gate insulating film which is provided over the source electrode layer or the drain electrode layer, and a gate electrode layer which overlaps with the first oxide semiconductor layer, the second oxide semiconductor layer, and the third oxide semiconductor layer and is provided over the gate insulating film. The second oxide semiconductor layer has a smaller energy gap than the first oxide semiconductor layer and the third oxide semiconductor layer.

In the above structure, the third oxide semiconductor layer is provided to be in contact with and cover the side surfaces of the first oxide semiconductor layer and the side surfaces of the second oxide semiconductor layer, so that the source electrode layer or the drain electrode layer formed over and in contact with the third oxide semiconductor layer is not in contact with the side surfaces of the second oxide semiconductor layer; thus, generation of leakage current (parasitic channel) between the source electrode layer and the drain electrode layer of the transistor is suppressed.

Further, a structure of one embodiment of the present invention is not particularly limited as long as a source electrode layer or a drain electrode layer is not in contact with the side surfaces of the second oxide semiconductor layer. For example, a following structure may be used: the side surfaces of the first oxide semiconductor layer extends beyond the side surfaces of the second oxide semiconductor layer, and the third oxide semiconductor layer is in contact with part of the top surface of the first oxide semiconductor layer.

Further, it is preferable that the transistor including the stack of oxide semiconductor layers include a channel formation region which overlaps with the gate electrode layer with the gate insulating film interposed therebetween, and a pair of low-resistance regions which are provided in the channel length direction so that the channel formation region is sandwiched therebetween. The low-resistance regions are formed by a method in which dopants are introduced into the stack of oxide semiconductor layers in a self-aligned manner with the use of the gate electrode layer overlapping with the stack of oxide semiconductor layers with the gate insulating film interposed therebetween as a mask.

The stack of oxide semiconductor layers including the low-resistance regions between which the channel formation region is sandwiched in the channel length direction, so that the on-state characteristics (e.g., on-state current and field-effect mobility) of the transistor are excellent, and high-speed operation and high-speed response of the transistor can be achieved. Further, the low-resistance regions are formed in a self-aligned manner and do not overlap with the gate electrode layer, so that the parasitic capacitance can be reduced. The reduction in the parasitic capacitance leads to a reduction in power consumption of the whole semiconductor device.

Further, dopants for forming the low-resistance regions are impurities changing the conductivity of the oxide semiconductor film (also referred to as dopants). As the dopants, one or more elements selected from a Group 15 element (typically, phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn) can be used.

Dopants pass through a film (a metal film, a metal oxide film, or a metal nitride film) containing metal elements and are introduced into the oxide semiconductor film by an implantation method. As a method for introducing the dopants, an ion implantation method, an ion doping method, a plasma immersion ion implantation method, or the like can be used. In that case, it is preferable to use a single ion of the dopants, a fluoride ion, or a chloride ion.

The concentration of the dopants in the low-resistance regions is preferably higher than or equal to $5 \times 10^{18}/\text{cm}^3$ and lower than or equal to $1 \times 10^{22}/\text{cm}^3$.

Further, depending on the thicknesses of the source electrode layer and the drain electrode layer or the condition for introducing the dopants, the dopants may be added to the stack of oxide semiconductor layers through the source electrode layer or the drain electrode layer. It is important to prevent the dopants from being added to the channel formation region; therefore, the thickness of the source electrode layer and the thickness of the drain electrode layer are smaller than the thickness of the gate electrode layer.

Further, in each of the above-described structures, the first oxide semiconductor layer is formed over and in contact with an oxide insulating film, and in the oxide insulating film, the thickness of the region which is in contact with the third oxide semiconductor layer is smaller than the thickness of the region which is in contact with the first oxide semiconductor layer. The structure in which part of the oxide insulating film is made thin can be obtained by etching the part of the oxide insulating film with the use of a mask used for forming the first oxide semiconductor layer into an island shape, for example. In this way, etching is performed on the part of the oxide insulating film, so that etching residue such as residue of the first oxide semiconductor layer is removed and generation of leakage current is suppressed.

Further, in the oxide insulating film, the thickness of the region which is in contact with the first oxide semiconductor layer is greater than or equal to 100 nm. The oxide insulating film which contains a large amount of (excess) oxygen and functions as a supply source is formed with a thickness greater than or equal to 100 nm to be in contact with the first oxide semiconductor layer, whereby oxygen can be supplied from the oxide insulating film to the oxide semiconductor film. In the above structure, the first oxide semiconductor layer and the oxide insulating layer may be heated in a state where the oxide insulating layer is in contact with at least part of the oxide semiconductor film so that oxygen is supplied to the first oxide semiconductor layer and the stack of oxide semiconductor layer including the first oxide semiconductor layer.

Further, a manufacturing method of a transistor is also one embodiment of the present invention, and the manufacturing method is as follows: forming a first oxide semiconductor layer over an oxide insulating film, forming a second oxide semiconductor layer over the first oxide semiconductor layer, forming a third oxide semiconductor layer over the second oxide semiconductor layer to cover side surfaces of the second oxide semiconductor layer, forming a drain electrode layer and a source electrode layer over the third oxide semiconductor layer, forming a gate insulating film covering the drain electrode layer and the source electrode layer, forming a gate electrode layer over the gate insulating film, and introducing dopants to at least the third oxide semiconductor layer in a self-aligned manner with the use of the gate electrode layer as a mask.

In the above-described manufacturing method, the oxide insulating film is formed over a semiconductor substrate including a transistor including silicon used for a channel formation region and contains a large amount of (excess) oxygen.

Further, in the above-described manufacturing method, it is preferable that after formation of the drain electrode layer and the source electrode layer, oxygen be introduced into at least the third oxide semiconductor layer in a self-aligned manner with the use of the drain electrode layer and the source electrode layer as masks before formation of the gate electrode layer. Oxygen (including at least one of an oxygen radical, an oxygen atom, and an oxygen ion) is introduced, so that oxygen may be supplied to at least the third oxide semiconductor layer. As a method for introducing oxygen, an ion implantation method, an ion doping method, a plasma immersion ion implantation method, plasma treatment, or the like may be used.

The on-state characteristics (e.g., on-state current and field-effect mobility) of the transistor can be improved.

Further, a normally-off transistor can be obtained. Further, according to one embodiment of the present invention, the threshold voltage of a normally-on transistor can be made to be close to zero.

BRIEF DESCRIPTION OF THE DRAWINGS

FIGS. 3A to 3C are each a cross-sectional view of another example of the semiconductor device of one embodiment of the present invention.

FIGS. 5A and 5B are each a cross-sectional view of a mode of a semiconductor device.

DETAILED DESCRIPTION OF THE INVENTION

Hereinafter, embodiments of the present invention are described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

In this embodiment, one embodiment of a semiconductor device and one embodiment of a manufacturing method of the semiconductor device are described with reference to FIGS. 1A to 1D and FIGS. 2A to 2D. In this embodiment, a transistor including a stack of oxide semiconductor layers is shown as an example of the semiconductor device.

Figure 1A:
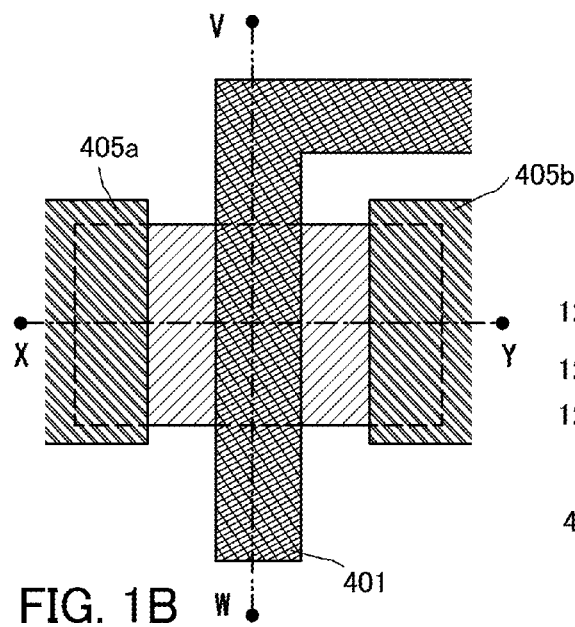
FIG. 1A is a top view of a semiconductor device of one embodiment of the present invention.
Figure 1C:
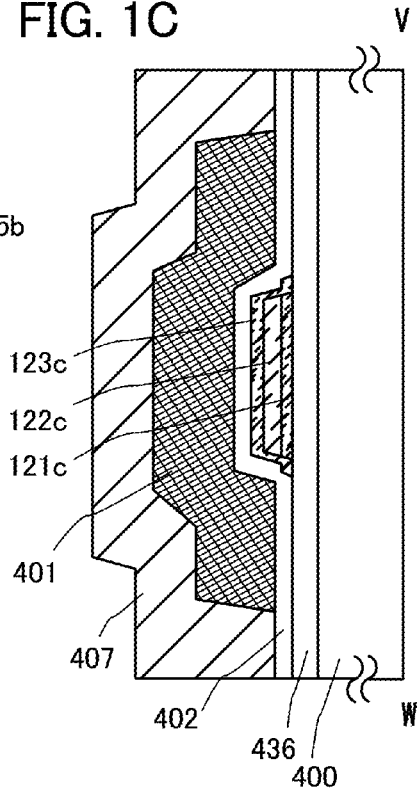
FIGS. 1B and 1C are cross-sectional views thereof.
Figure 1B:
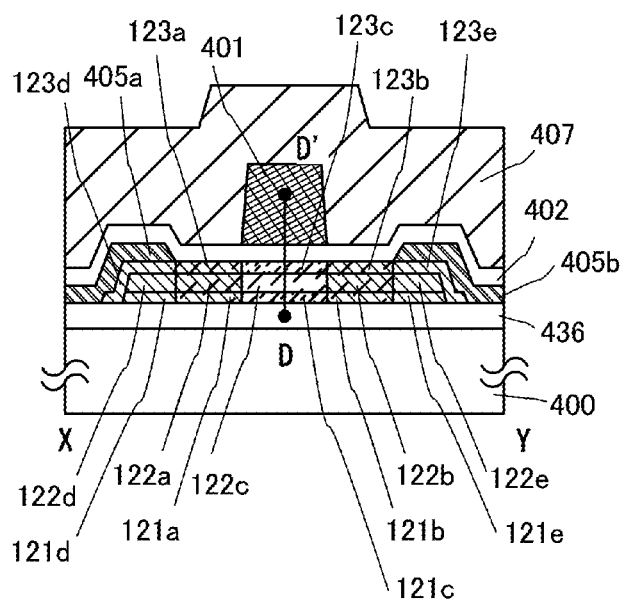

A transistor illustrated in FIGS. 1A to 1C is an example of a top-gate transistor. Note that although an example of a top-gate transistor is illustrated in FIGS. 1A to 1C, the present invention is not limited thereto and a bottom-gate transistor can also be manufactured, for example. Also, a dual-gate transistor can also be manufactured. In the dual-gate transistor, gate electrodes are provided over and below the stack of oxide semiconductor layers. FIG. 1A is a top view of the transistor, a cross section taken along the chain line X-Y of FIG. 1A corresponds to the cross-sectional view of FIG. 1B, and a cross section taken along the chain line V-W of FIG. 1A corresponds to the cross-sectional view of FIG. 1C. In FIGS. 1B and 1C, interfaces between oxide semiconductor layers are schematically denoted by a line. In some cases, the interfaces between the oxide semiconductor layers are unclear depending on the material, the formation condition, or heat treatment. When the interfaces are unclear, a portion including different oxide semiconductor layers, which is referred to as mixed region or mixed layer, is formed in some cases.

As illustrated in FIG. 1B, which is a cross-sectional view of the transistor in the channel length direction, the transistor includes, over a substrate 400 provided with an insulating film 436 to have an insulating surface, a first oxide semiconductor layer, a second oxide semiconductor layer, a third oxide semiconductor layer, a source electrode layer 405a, a drain electrode layer 405b, a gate insulating film 402, and a gate electrode layer 401. The first oxide semiconductor layer is formed over and in contact with the oxide insulating film 436, and the second oxide semiconductor layer is formed over the first oxide semiconductor layer. Further, the third oxide semiconductor layer is provided to cover the side surfaces of the first oxide semiconductor layer and the second oxide semiconductor layer. Note that the periphery of the third oxide semiconductor layer is in contact with the oxide insulating film 436.

Note that the energy gap of the third oxide semiconductor layer is substantially equal to the energy gap of the first oxide semiconductor layer, and is larger than the energy gap of the second oxide semiconductor layer.

A channel formation region which overlaps with the gate electrode layer 401 with the gate insulating film 402 interposed therebetween has a three-layered structure of a first channel formation region 121c, a second channel formation region 122c, and a third channel formation region 123c.

Further, in the channel length direction, first low-resistance regions 121a and 121b between which the first channel formation region 121c is sandwiched, second low-resistance regions 122a and 122b between which the second channel formation region 122c is sandwiched, and third low-resistance regions 123a and 123b between which the third channel formation region 123c is sandwiched are provided.

Further, a first region 121d, a second region 122d, and a third region 123d which overlap with a source electrode layer 405a and a first region 121e, a second region 122e, and a third region 123e which overlap with a drain electrode layer 405b are provided.

FIG. 1C is a cross-sectional view of the transistor in the channel width direction. As in FIG. 1B, end portions of the second oxide semiconductor layer, that is, side surfaces of the second region 122d and 122e are covered with end portions of the third oxide semiconductor layer, that is, side surfaces of the third region 123d and 123e, and is in contact with neither the source electrode layer 405a nor the drain electrode layer 405b. With such a structure, generation of leakage current (parasitic channel) between the source electrode layer 405a and the drain electrode layer 405b is suppressed.

Figure 1D:
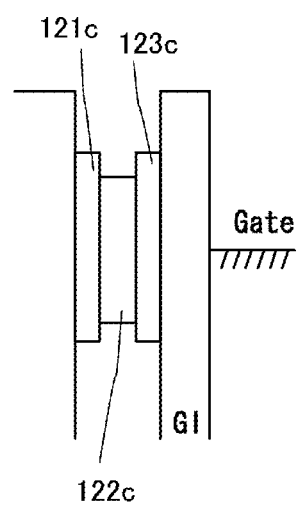
FIG. 1D is an energy band diagram thereof.

Further, FIG. 1D illustrates an energy band diagram in the thickness direction (between D-D') in FIG. 1B. In this embodiment, materials for a first oxide semiconductor layer, a second oxide semiconductor layer, and a third oxide semiconductor layer are selected in order to obtain the energy band diagram illustrated in FIG. 1D. Note that when a buried channel is formed, sufficient effects can be obtained. Thus, an energy band diagram is not necessarily limited to a structure in which both conduction band and valence band have a depressed portion; for example, a structure in which only conduction band has a depressed portion may be employed.

An example of a manufacturing method of a transistor is illustrated in FIGS. 2A to 2D.

First, the oxide insulating film 436, a first oxide semiconductor layer 101, and a second oxide semiconductor layer 102 are formed over the substrate 400 having an insulating surface.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used as the substrate 400. Still alternatively, any of these substrates further provided with a semiconductor element may be used as the substrate 400.

The semiconductor device may be manufactured using a flexible substrate as the substrate 400. In order to manufacture a flexible semiconductor device, the transistor including the stack of oxide semiconductor layers may be directly formed over a flexible substrate. Alternatively, the transistor including the stack of oxide semiconductor layers may be formed over a manufacturing substrate, and then, the transistor may be separated and transferred to a flexible substrate. Note that in order to separate the transistor from the manufacturing substrate and transfer it to the flexible substrate, a separation layer may be provided between the manufacturing substrate and the transistor including the stack of oxide semiconductor layers.

The oxide insulating film 436 can be formed by a plasma CVD method, a sputtering method, or the like using any of silicon oxide, silicon oxynitride, aluminum oxide, aluminum oxynitride, hafnium oxide, gallium oxide, silicon nitride oxide, and aluminum nitride oxide, or a mixed material thereof. The oxide insulating film 436 may be a single layer or a stacked layer. A silicon oxide film is formed by a sputtering method as the oxide insulating film 436 in this embodiment.

The oxide insulating film 436, which is in contact with the lowermost layer and the uppermost layer of the stack of oxide semiconductor layers, preferably contains oxygen which exceeds at least the stoichiometric composition ratio in the film (bulk). For example, in the case where a silicon oxide film is used as the oxide insulating film 436, the composition formula is $SiO_{2+\alpha}$ ($\alpha$>0). By using such a film as the oxide insulating film 436, oxygen can be supplied to the stack of oxide semiconductor layers formed over the oxide insulating film 436, leading to favorable characteristics. By supplying oxygen to the stack of oxide semiconductor layers, oxygen defects in the film can be repaired.

In the formation process of the stack of oxide semiconductor layers formed over the oxide insulating film 436, in order to prevent the first oxide semiconductor layer 101 and the second oxide semiconductor layer 102 from containing hydrogen or water, as pretreatment for forming the first oxide semiconductor layer 101 and the second oxide semiconductor layer 102, it is preferable that preheating be performed on a substrate over which the oxide insulating film 436 is formed in a preheating chamber of a sputtering apparatus, and impurities such as hydrogen, water, or the like attached to the substrate and the oxide insulating film 436 be eliminated and exhausted. As an exhaustion unit provided in the preheating chamber, a cryopump is preferable.

An oxide semiconductor to be used for the stack of oxide semiconductor layers preferably contains at least indium (In) or zinc (Zn). In particular, In and Zn are preferably contained. In addition, as a stabilizer for reducing the variation in electric characteristics of a transistor using the oxide, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure. Note that the single crystal oxide semiconductor and the non-single-crystal oxide semiconductor have different energy gaps even when they are formed using the same material in some cases; thus, it is important to select a crystal state as appropriate. Materials for the first oxide semiconductor layer 101 and the second oxide semiconductor layer 102 are selected in order to obtain the energy band shown in FIG. 1D.

Further, as the stack of oxide semiconductor layers, an oxide semiconductor film including a crystal and having crystallinity (crystalline oxide semiconductor film) can be used. A crystalline state in a crystalline oxide semiconductor film may be a state in which crystal axes are oriented in random directions or a state in which crystal axes are oriented in a certain direction.

For example, as the crystalline oxide semiconductor film, an oxide semiconductor film including a crystal having a c-axis substantially perpendicular to the surface of the oxide semiconductor film can be used.

The oxide semiconductor film including a crystal having a c-axis substantially perpendicular to the surface of the oxide semiconductor film has neither a single crystal structure nor an amorphous structure, and is a crystalline oxide semiconductor having a c-axis alignment (also referred to as c-axis aligned crystalline oxide semiconductor (CAAC-OS)).

CAAC-OS is an oxide semiconductor containing a crystal with c-axis alignment which has a triangular or hexagonal atomic arrangement when seen from the direction of the a-b plane, the surface, or the interface and in which metal atoms are arranged in a layered manner, or metal atoms and oxygen atoms are arranged in a layered manner along the c-axis, and the direction of the a-axis or the b-axis is varied in the a-b plane (or the surface or the interface), that is, which rotates around the c-axis.

In a broad sense, "CAAC-OS" means a non-single-crystal material including a phase which has a triangular, hexagonal, regular triangular, or regular hexagonal atomic arrangement when seen from the direction perpendicular to the a-b plane and in which metal atoms are arranged in a layered manner, or metal atoms and oxygen atoms are arranged in a layered manner when seen from the direction perpendicular to the c-axis direction.

The CAAC-OS is not a single crystal, but is not only in an amorphous state. The CAAC-OS includes a crystallized portion (crystalline portion), and a boundary between one crystalline portion and another crystalline portion is not clear in some positions.

Nitrogen may be substituted for part of oxygen contained in the CAAC-OS. The c-axes of individual crystalline portions included in the CAAC-OS may be aligned in one direction (e.g., the direction perpendicular to a surface of a substrate over which the CAAC-OS is formed, or a surface, a film surface, and an interface of the CAAC-OS, or the like). Alternatively, the normals of the a-b planes of the individual crystalline portions included in the CAAC-OS may be aligned in one direction (e.g., a direction perpendicular to the substrate surface or the surface, the film surface, the interface, or the like of the CAAC-OS).

With the crystalline oxide semiconductor film, it is possible to provide a highly reliable semiconductor device in which changes in electrical characteristics of the transistor due to irradiation with visible light or ultraviolet light is suppressed.

The first oxide semiconductor layer 101 and the second oxide semiconductor layer 102 each have a thickness greater than or equal to 5 nm and less than or equal to 100 nm (preferably greater than or equal to 5 nm and less than or equal to 30 nm) and can be formed by a sputtering method, a molecular beam epitaxy (MBE) method, a CVD method, a pulsed laser deposition method, an atomic layer deposition (ALD) method, or the like as appropriate. The first oxide semiconductor layer 101 and the second oxide semiconductor layer 102 may be formed using a sputtering apparatus which performs film formation with surfaces of a plurality of substrates set substantially perpendicular to a surface of a sputtering target, which is a so-called columnar plasma (CP) sputtering system.

Note that it is preferable that the first oxide semiconductor layer 101 and the second oxide semiconductor layer 102 be formed under a condition that a lot of oxygen is contained during film formation (e.g., formed by a sputtering method in a 100% oxygen atmosphere), so that a film containing a lot of oxygen (preferably including a region where the oxygen content is higher than that in the stoichiometric composition of the oxide semiconductor in a crystalline state) is formed.

Note that in this embodiment, a target used for forming the first oxide semiconductor layer 101 by a sputtering method is, for example, an oxide target having a composition ratio of $In_2O_3:Ga_2O_3:ZnO=1:1:2$ [molar ratio], so that an In—Ga—Zn-based oxide film is formed. Without limitation to the material and the component of the target, for example, a metal oxide target having a composition ratio of $In_2O_3:Ga_2O_3:ZnO=1:1:1$ [molar ratio] may be used.

It is preferable to use a high-purity gas from which impurities such as hydrogen, water, a hydroxyl group, or hydride are removed as a sputtering gas used when the first oxide semiconductor layer 101 and the second oxide semiconductor layer 102 are formed.

The oxide insulating film 436 and the stack of oxide semiconductor layers are preferably formed in succession without exposure to the air. When the oxide insulating film 436 and the stack of oxide semiconductor layers are formed in succession without exposure to the air, impurities such as hydrogen or moisture can be prevented from being adsorbed onto a surface of the oxide insulating film 436.

Figure 2A:
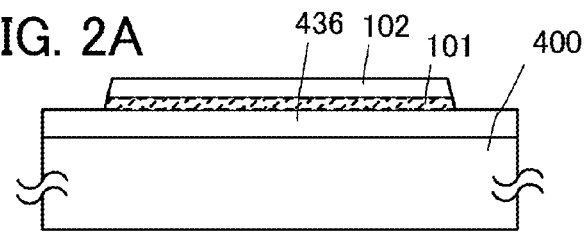
FIGS. 2A to 2D are process cross-sectional views of a semiconductor device of one embodiment of the present invention.
Figure 2B:
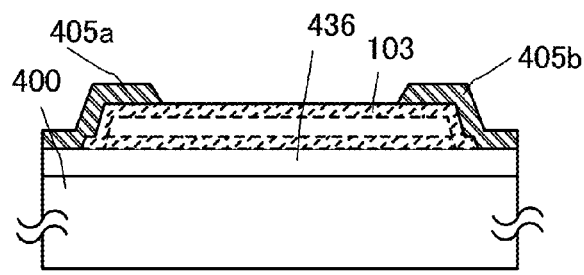

In this embodiment, as illustrated in FIG. 2A, the stack of oxide semiconductor layers formed is processed into the first island-shaped oxide semiconductor layer 101 and the second island-shaped oxide semiconductor layer 102 by a photolithography step. A resist mask used for forming the first island-shaped oxide semiconductor layer 101 and the second island-shaped oxide semiconductor layer 102 may be formed by an inkjet method. Formation of the resist mask by an inkjet method needs no photomask; thus, manufacturing cost can be reduced.

Note that the etching of the stack of oxide semiconductor layers may be dry etching, wet etching, or both wet etching and dry etching. As an etchant used for wet etching of the oxide semiconductor film, for example, a mixed solution of phosphoric acid, acetic acid, and nitric acid, or the like can be used. In addition, ITO07N (produced by KANTO CHEMICAL CO., INC.) may also be used.

Next, a third oxide semiconductor layer 103 is formed to cover the first island-shaped oxide semiconductor layer 101 and the second island-shaped oxide semiconductor layer 102. The third oxide semiconductor layer 103 is formed with the use of the same target as the target used for the first oxide semiconductor layer 101. The formation condition of the third oxide semiconductor layer 103 is similar to that of the first oxide semiconductor layer 101; thus, the description thereof is omitted here. Note that the third oxide semiconductor layer 103 is formed so as to overlap with the second oxide semiconductor layer 102, and to have a larger top area than the second oxide semiconductor layer 102 by a second photolithography step.

Next, heat treatment for removal of excess hydrogen including water or a hydroxy group (dehydration or dehydrogenation) may be performed on the first oxide semiconductor layer 101, the second oxide semiconductor layer 102, and the third oxide semiconductor layer 103. The temperature of the heat treatment is higher than or equal to 300° C. and lower than or equal to 700° C., or lower than the strain point of the substrate. The heat treatment can be performed under reduced pressure, a nitrogen atmosphere, or the like. A substrate is introduced into an electric furnace which is one of the heat treatment apparatuses and heat treatment is performed on the first oxide semiconductor layer 101, the second oxide semiconductor layer 102, and the third oxide semiconductor layer 103 at 450° C. in a nitrogen atmosphere for an hour.

Note that a heat treatment apparatus used is not limited to an electric furnace, and a device for heating a process object by heat conduction or heat radiation from a heating element such as a resistance heating element may be alternatively used. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

Note that in heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is set to preferably higher than or equal to 6N (99.9999%), further preferably higher than or equal to 7N (99.99999%) (that is, the impurity concentration is preferably less than or equal to 1 ppm, further preferably less than or equal to 0.1 ppm).

In addition, after the first oxide semiconductor layer 101, the second oxide semiconductor layer 102, and the third oxide semiconductor layer 103 are heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, further preferably less than or equal to 10 ppb, in the measurement with the use of a dew point meter of a cavity ring down laser spectroscopy (CRDS) system) may be introduced into the same furnace while the heating temperature is being maintained or being gradually decreased. It is preferable that water, hydrogen, or the like be not contained in the oxygen gas or the $N_2O$ gas. The purity of the oxygen gas or the $N_2O$ gas which is introduced into the heat treatment apparatus is preferably 6N or more, further preferably 7N or more (i.e., the impurity concentration in the oxygen gas or the $N_2O$ gas is preferably less than or equal to 1 ppm, further preferably less than or equal to 0.1 ppm). The oxygen gas or the $N_2O$ gas acts to supply oxygen that is a main component of the oxide semiconductor and that is reduced by removing an impurity for the dehydration or dehydrogenation, so that the first oxide semiconductor layer 101, the second oxide semiconductor layer 102, and the third oxide semiconductor layer 103 can be highly purified and become an electrically i-type (intrinsic) oxide semiconductor film.

Next, a conductive film for forming a source electrode layer and a drain electrode layer (including a wiring formed using the same layer as the source electrode layer and the drain electrode layer) is formed over the third oxide semiconductor layer 103. The conductive film is formed using a material that can withstand heat treatment in a later step. As the conductive film used for the source electrode layer and the drain electrode layer, for example, a metal film containing an element selected from Al, Cr, Cu, Ta, Ti, Mo, and W and a metal nitride film containing any of the above elements as its component (a titanium nitride film, a molybdenum nitride film, and a tungsten nitride film) can be used. A metal film having a high melting point such as Ti, Mo, W, or the like or a metal nitride film of any of these elements (a titanium nitride film, a molybdenum nitride film, and a tungsten nitride film) may be stacked on one of or both of a lower side or an upper side of a metal film of Al, Cu, or the like. Alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials in which silicon or silicon oxide is contained can be used.

A resist mask is formed over the conductive film by a third photolithography step. Etching is selectively performed, so that the source electrode layer 405a and the drain electrode layer 405b are formed. Then, the resist mask is removed. A cross-sectional view of this stage corresponds to FIG. 2B. In this embodiment, a tungsten film having a thickness of 10 nm is formed as the source electrode layer 405a and the drain electrode layer 405b. When the thicknesses of the source electrode layer 405a and the drain electrode layer 405b are small, coverage with the gate insulating film 402 which is formed thereover can be improved, and dopants can be introduced into at least the third oxide semiconductor layer 103 which is provided under the source electrode layer 405a and the drain electrode layer 405b through the source electrode layer 405a and the drain electrode layer 405b.

Next, the gate insulating film 402 is formed to cover the third oxide semiconductor layer 103, the source electrode layer 405a, and the drain electrode layer 405b.

The gate insulating film 402 can be formed with a thickness of 1 nm to 20 nm inclusive by a sputtering method, an MBE method, a CVD method, a pulsed laser deposition method, an ALD method, or the like as appropriate. The gate insulating film 402 may be formed using a sputtering apparatus which performs film formation with surfaces of a plurality of substrates set substantially perpendicular to a surface of a sputtering target, which is a so-called columnar plasma (CP) sputtering system.

The gate insulating film 402 can be formed using a silicon oxide film, a gallium oxide film, an aluminum oxide film, a silicon nitride film, a silicon oxynitride film, an aluminum oxynitride film, or a silicon nitride oxide film.

The gate insulating film 402 can be formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, whereby gate leakage current can be reduced. Further, the gate insulating film 402 may have a single-layer structure or a stacked-layer structure.

Figure 2C:
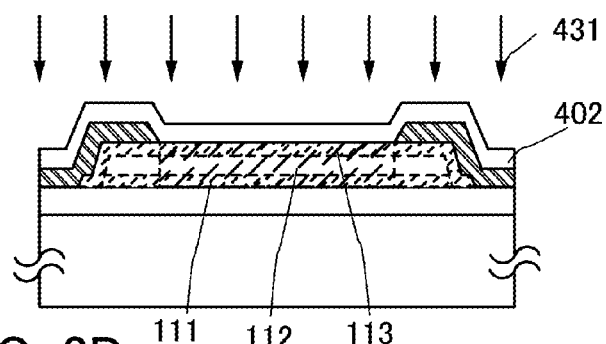

Next, as illustrated in FIG. 2C, oxygen 431 including at least one of oxygen radicals, oxygen atoms, and oxygen ions is introduced into at least the third oxide semiconductor layer 103 with the use of the source electrode layer 405a and the drain electrode layer 405b as masks. As illustrated in FIG. 2C, a first oxygen-excess region 111, a second oxygen-excess region 112, and a third oxygen-excess region 113 contain oxygen more than regions of the stack of oxide semiconductor layers overlapping with the source electrode layer 405a or the drain electrode layer 405b. As a method for introducing oxygen, an ion implantation method, an ion doping method, a plasma immersion ion implantation method, plasma treatment, or the like may be used.

Then, the gate electrode layer 401 is formed over the gate insulating film 402 by a plasma CVD method, a sputtering method, or the like. The gate electrode layer 401 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode layer 401. The gate electrode layer 401 may have a single-layer structure or a stacked-layer structure.

The gate electrode layer 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 401 has a stacked structure of the above conductive material and the above metal material.

As one layer of the gate electrode layer 401 which is in contact with the gate insulating film 402, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function higher than or equal to 5 eV, preferably higher than or equal to 5.5 eV; thus, when these are used as the gate electrode layer, the threshold voltage of the electric characteristics of the transistor can be positive. Accordingly, a so-called normally-off switching element can be provided.

Next, a process for selectively introducing dopants 421 is performed. With this process, the dopants 421 are introduced into the stack of oxide semiconductor layers through the gate insulating film 402 with the gate electrode layer 401 as a mask, whereby the first low-resistance regions 121a and 121b, the second low-resistance regions 122a and 122b, and the third low-resistance region 123a and 123b are formed. With this process, in the channel length direction, the first low-resistance regions 121a and 121b between which the first channel formation region 121c is sandwiched, the second low-resistance regions 122a and 122b between which the second channel formation region 122c is sandwiched, and the third low-resistance regions 123a and 123b between which the third channel formation region 123c is sandwiched are formed in a self-aligned manner.

Figure 2D:
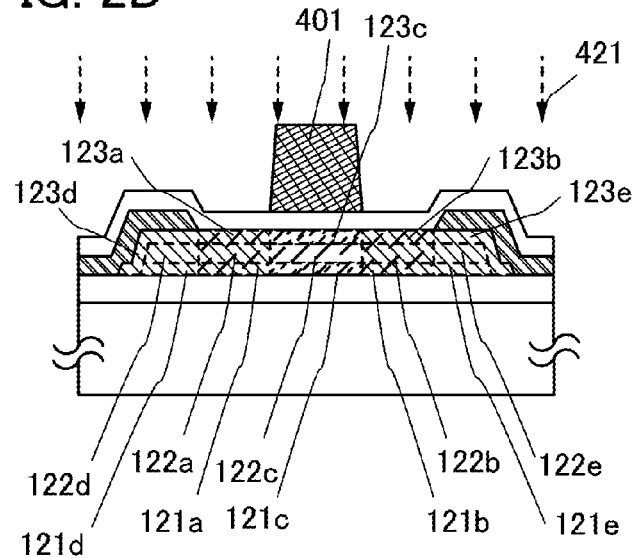

Further, with this process, the dopants 421 are selectively introduced into at least the third oxide semiconductor layer 103 through the gate insulating film 402, the source electrode layer 405a, and the drain electrode layer 405b, whereby the first regions 121d and 121e, the second regions 122d and 122e, and the third regions 123d and 123e are formed (see FIG. 2D). The dopants 421 are introduced into the stack of oxide semiconductor layers below the source electrode layer 405a and the drain electrode layer 405b, so that the resistance of the first regions 121d and 121e, the second regions 122d and 122e, and the third regions 123d and 123e can be reduced.

In this embodiment, because the source electrode layer 405a and the drain electrode layer 405b are thin, the dopants 421 are also introduced into the stack of oxide semiconductor layers formed below the source electrode layer 405a and the drain electrode layer 405b. A structure in which the dopants 421 are not introduced into the stack of oxide semiconductor layers formed below the source electrode layer 405a and the drain electrode layer 405b may be formed depending on the thicknesses of the source electrode layer 405a and the drain electrode layer 405b or the introduction condition of the dopants 421.

The treatment for introducing the dopants 421 may be controlled by appropriately setting acceleration voltage, a dose, or the thickness of the gate insulating film 402 through which the oxygen passes. For example, in the case where boron is used and boron ions are implanted by an ion implantation method, the dose can be greater than or equal to $1 \times 10^{13}$ ions/cm$^2$ and less than or equal to $5 \times 10^{16}$ ions/cm$^2$.

The concentration of the dopants 421 in the first low-resistance regions 121a and 121b, the second low-resistance regions 122a and 122b, and the third low-resistance region 123a and 123b is preferably higher than or equal to $5 \times 10^{18}$/cm$^3$ and lower than or equal to $1 \times 10^{22}$/cm$^3$.

The dopants 421 may be introduced while the substrate 400 is heated.

Note that the treatment for introducing the dopants 421 to the first low-resistance regions 121a and 121b, the second low-resistance regions 122a and 122b, and the third low-resistance region 123a and 123b may be performed plural times, and a plurality of kinds of dopants may be used.

Further, after the treatment for introducing the dopants 421, heat treatment may be performed. For the heating condition, heat treatment is preferably performed at higher than or equal to 300° C. and lower than or equal to 700° C., further preferably higher than or equal to 300° C. and lower than or equal to 450° C. in an oxygen atmosphere for one hour. Alternatively, the heat treatment may be performed in a nitrogen atmosphere, a reduced pressure, or an air atmosphere (ultra-dry air).

When at least one layer of the stack of oxide semiconductor layers is a crystalline oxide semiconductor film, the stack of oxide semiconductor layers is made amorphous partly in some cases because of the introduction of the dopants 421. In that case, the crystallinity of the stack of oxide semiconductor layers can be recovered by performing heat treatment thereon after the introduction of the dopants 421.

In this embodiment, boron is used as the dopants 421, the first low-resistance regions 121a and 121b, the second low-resistance regions 122a and 122b, and the third low-resistance region 123a and 123b each contain boron.

Through the process, the transistor of this embodiment is manufactured. In the transistor of this embodiment, in the stack of oxide semiconductor layers which are highly purified and whose oxygen defects are repaired, impurities such as hydrogen or water are sufficiently removed; the hydrogen concentration in the stack of oxide semiconductor layers is lower than or equal to $5\times10^{19}/cm^3$, preferably lower than or equal to $5\times10^{18}/cm^3$. Note that the concentration of hydrogen in the oxide semiconductor is measured by secondary ion mass spectrometry (SIMS).

Then, an insulating film 407 is formed to cover the transistor (FIGS. 1B and 1C).

The oxide insulating film 407 can be formed using an inorganic insulating film such as, typically, an aluminum oxide film, a silicon oxynitride film, an aluminum oxynitride film, or a gallium oxide film. For example, as the oxide insulating film 407, a stacked layer of a silicon oxide film and an aluminum oxide film can be used.

An aluminum oxide film which can be used as the insulating film 407 has an excellent shielding effect (blocking effect), which is not permeable to either oxygen or impurities such as hydrogen or moisture.

Further, the insulating film 407 may be formed using a planarization insulating film. As the planarization insulating film, an organic material such as a polyimide resin, an acrylic resin, or a benzocyclobutene-based resin can be used. Other than such organic materials, it is also possible to use a low-dielectric constant material (low-k material) or the like. Note that the planarization insulating film may be formed by stacking a plurality of insulating films formed from these materials.

Then, an opening reaching the source electrode layer 405a or the drain electrode layer 405b is formed in the insulating film 407, and a wiring layer electrically connected to the source electrode layer 405a or the drain electrode layer 405b is formed. A transistor is connected to another transistor via this wiring layer, so that a variety of circuits can be manufactured.

A semiconductor device having high performance and high reliability can be provided with the use of the transistor having high electric characteristics obtained in the above manner.

Further, according to this embodiment, the current value in the off state (off-state current value) per micrometer of channel width of the transistor using the stack of oxide semiconductor layers in the channel formation region is less than or equal to 100 zA/μm of channel width at room temperature (1 zA (zeptoampere)=$1\times10^{-21}$ A), preferably less than or equal to 10 zA/μm, further preferably less than or equal to 1 zA/μm, still further preferably less than or equal to 100 yA/μm.

Embodiment 2

In this embodiment, an example of a transistor which can be obtained by changing part of the process in Embodiment 1 is illustrated in FIGS. 3A to 3C. The same portions are denoted by the same reference numerals for simplicity. The transistor described in this embodiment is different from the transistor in Embodiment 1 just in part thereof; thus, the same portions are denoted by the same reference numerals for simplicity, and detailed description of the same portion is omitted here.

FIG. 3A illustrates a structure in which a region of the oxide insulating film 436 which does not overlap with the stack of oxide semiconductor layers is etched to be thin at the time of etching of the stack of oxide semiconductor layers. Etching is performed on up to part of the oxide insulating film so that etching residue such as residue of the first oxide semiconductor layer is removed, and generation of leakage current is suppressed. Further, in the structure of the transistor in FIG. 3A, dopants are hardly introduced into the first oxide semiconductor layer 101 by changing the condition for introducing oxygen or dopants. With such a structure, damages at the time of introduction of oxygen or dopants can be suppressed. Further, few dopants may be introduced into the second oxide semiconductor layer 102 by changing the condition for introducing oxygen or dopants.

Further, FIG. 3B is a structure in which the side surfaces of the first oxide semiconductor layer extends beyond the side surfaces of the second oxide semiconductor layer and the third oxide semiconductor layer is in contact with part of the top surface of the first oxide semiconductor layer, which is obtained by three-time photolithography steps using a first mask used for etching of the first oxide semiconductor layer, a second mask used for etching of the second oxide semiconductor layer, and a third mask used for etching of the third oxide semiconductor layer. The third regions 123d and 123e corresponding to the end portions of the third oxide semiconductor layer are in contact with and overlap with the first regions 121d and 121e corresponding to the end portions of the first oxide semiconductor layer.

Further, FIG. 3C illustrates an example in which the source electrode layer and the drain electrode layer each have a stacked layer structure, and a wiring layer 465a and a wiring layer 465b reaching a conductive film below the source electrode layer and the drain electrode layer are formed. In this embodiment, a tungsten film or a tantalum nitride film is used as lower layers which are a source electrode layer 405c and a drain electrode layer 405d, and a copper film or an aluminum film is used as upper layers which are the source electrode layer 405a and the drain electrode layer 405b and are thicker than the lower layers. In FIG. 3C, the source electrode layers 405a and 405c and the drain electrode layers 405b and 405d are formed with a thickness of 5 nm to 15 nm inclusive, so that the coverage with the gate insulating film 402 which is formed thereover is made excellent. Note that in this embodiment, in order to reduce contact resistance, the wiring layer 465a and the wiring layer 465b are a stacked layer of a tantalum nitride film and a copper film, or a stacked layer of a tantalum nitride film and a tungsten film.

Further, this embodiment can be freely combined with Embodiment 1.

Embodiment 3

A semiconductor device having a display function (also referred to as display device) can be manufactured using the transistor described in Embodiment 1 or 2. Moreover, some or all of driver circuits which include transistors can be formed over a substrate where a pixel portion is formed, whereby a system-on-panel can be obtained.

Figure 4A:
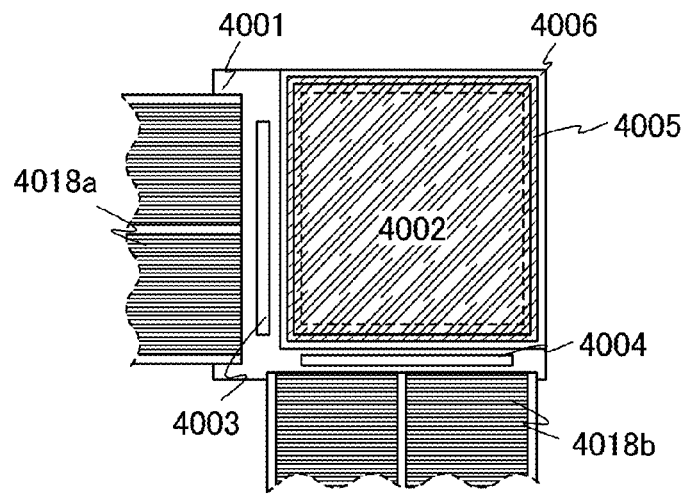
FIGS. 4A to 4C are each a top view illustrating a mode of a semiconductor device.

In FIG. 4A, a sealant 4005 is provided so as to surround a pixel portion 4002 provided over a first substrate 4001, and the pixel portion 4002 is sealed by a second substrate 4006. In FIG. 4A, a signal line driver circuit 4003 and a scan line driver circuit 4004 which are each formed using a single crystal semiconductor film or a polycrystalline semiconductor film over a substrate prepared separately are mounted in regions that are different from the region surrounded by the sealant 4005 over the first substrate 4001. Various signals and potentials are supplied to the signal line driver circuit 4003, the scan line driver circuit 4004, or the pixel portion 4002 from flexible printed circuits (FPCs) 4018a and 4018b.

Figure 4B:
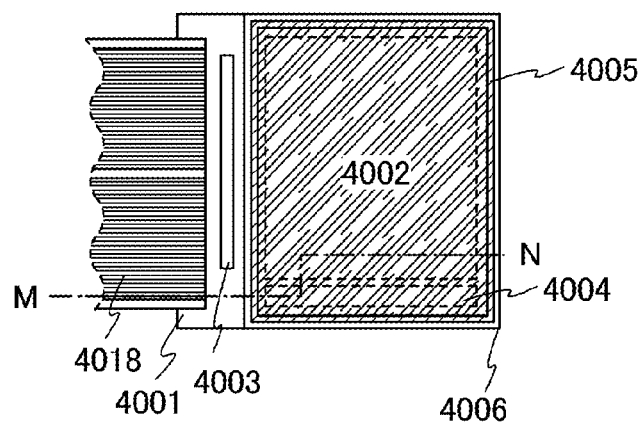
Figure 4C:
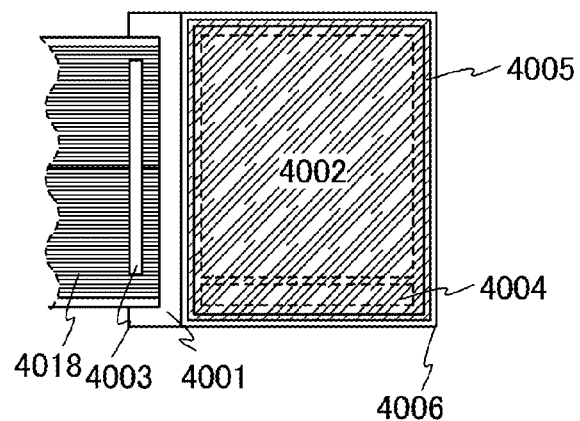

In FIGS. 4B and 4C, the sealant 4005 is provided to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element by the first substrate 4001, the sealant 4005, and the second substrate 4006. In FIGS. 4B and 4C, the signal line driver circuit 4003 which is formed using a single crystal semiconductor film or a polycrystalline semiconductor film over a substrate prepared separately is mounted in a region that is different from the region surrounded by the sealant 4005 over the first substrate 4001. In FIGS. 4B and 4C, various signals and potentials are supplied to the signal line driver circuit 4003 which is separately formed, the scan line driver circuit 4004, or the pixel portion 4002 from an FPC 4018.

Although FIGS. 4B and 4C each illustrate an example in which the signal line driver circuit 4003 is formed separately and mounted on the first substrate 4001, one embodiment of the present invention is not limited to this structure. The scan line driver circuit may be formed separately and then mounted, or only part of the signal line driver circuit or part of the scan line driver circuit may be formed separately and then mounted.

Note that there is no particular limitation on the method of connecting a separately formed driver circuit, and a chip on glass (COG) method, a wire bonding method, a tape automated bonding (TAB) method, or the like can be used. FIG. 4A illustrates an example in which the signal line driver circuit 4003 and the scan line driver circuit 4004 are mounted by a COG method. FIG. 4B illustrates an example in which the signal line driver circuit 4003 is mounted by a COG method. FIG. 4C illustrates an example in which the signal line driver circuit 4003 is mounted by a TAB method.

In addition, the display device includes a panel in which the display element is sealed, and a module in which an IC or the like including a controller is mounted on the panel.

In addition, the display device includes a panel in which the display element is sealed, and a module in which an IC or the like including a controller is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and the transistor described in Embodiment 1 or 2 can be applied thereto.

As the display element provided in the display device, a liquid crystal element (also referred to as liquid crystal display element) or a light-emitting element (also referred to as light-emitting display element) can be used. The light-emitting element includes, in its category, an element whose luminance is controlled by current or voltage and specifically includes, in its category, an inorganic electroluminescent (EL) element, an organic EL element, and the like. Furthermore, a display medium whose contrast is changed by an electric effect, such as electronic ink, can be used.

Embodiments of the semiconductor device are described with reference to FIGS. 4A to 4C and FIGS. 5A and 5B. FIGS. 5A and 5B correspond to cross-sectional views along line M-N in FIG. 4A.

As illustrated in FIGS. 5A and 5B, the semiconductor devices each include a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source electrode layers and drain electrode layers of transistors 4040, 4010, and 4011.

The pixel portion 4002 and the scan line driver circuit 4004 which are provided over the first substrate 4001 include a plurality of transistors. In FIGS. 4A to 4C and FIGS. 5A and 5B, the transistor 4040 included in the pixel portion 4002 and the transistor 4011 included in the scan line driver circuit 4004 are illustrated as an example. In FIG. 5A, an insulating film 4020 is provided over the transistors 4040 and 4011. In FIG. 5B, an insulating film 4021 is further provided. Note that an insulating film 4023 is an insulating film functioning as a base film.

The transistor including a buried channel described in Embodiment 1 or 2 can be applied to the transistor 4011 included in the scanning line driver circuit 4004. The transistor including a buried channel has excellent on-state characteristics (e.g., on-state current and field-effect mobility), and high-speed operation and high-speed response of the scanning line driver circuit 4004 can be achieved. In this embodiment, an example in which a transistor having a structure similar to that of the transistor described in Embodiment 1 is used is described.

A transistor 4010 provided in the pixel portion 4002 is electrically connected to a display element to form a display panel. A variety of display elements can be used as the display element as long as display can be performed.

A buried channel is not necessarily provided for a transistor 4040 included in the pixel portion 4002; thus, the transistor 4040 in which a single layer of an oxide semiconductor layer is used for a channel formation region is provided. Accordingly, the transistor 4040 can be manufactured through the same steps as the transistor 4011 without increase in the number of manufacturing steps. An oxide semiconductor layer of the transistor 4040 can be formed through the same steps as the third oxide semiconductor layer of the transistor 4011. When a display device is not large, the transistor 4040 is not particularly required to have excellent on-state characteristics. When the transistor 4040 has a single layer of an oxide semiconductor layer, the transistor 4040 has a lower off-state current value than the transistor 4011, and a display device with low power consumption can be obtained.

An example of a liquid crystal display device using a liquid crystal element as a display element is illustrated in FIG. 5A. In FIG. 5A, a liquid crystal element 4013 which is a display element includes the first electrode layer 4030, a second electrode layer 4031, and a liquid crystal layer 4008. Insulating films 4032 and 4033 functioning as alignment films are provided so that the liquid crystal layer 4008 is interposed therebetween. The second electrode layer 4031 is provided on the second substrate 4006 side, and the first electrode layer 4030 and the second electrode layer 4031 are stacked with the liquid crystal layer 4008 interposed therebetween.

A columnar spacer denoted by reference numeral 4035 is obtained by selective etching of an insulating film and is provided in order to control the thickness (cell gap) of the liquid crystal layer 4008. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. A blue phase is one of liquid crystal phases, which is generated just before a cholesteric phase changes into an isotropic phase while the temperature of a cholesteric liquid crystal is increased. The blue phase can be exhibited using a liquid crystal composition which is a mixture of a liquid crystal and a chiral agent. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition which exhibits a blue phase has a short response time, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved. A transistor formed using an oxide semiconductor film has a possibility that the electric characteristics of the transistor may fluctuate significantly by the influence of static electricity and deviate from the designed range. Therefore, it is more effective to use a liquid crystal composition exhibiting a blue phase for the liquid crystal display device including the transistor formed using an oxide semiconductor film.

The specific resistivity of the liquid crystal material is higher than or equal to $1\times10^9$ Ω·cm, preferably higher than or equal to $1\times10^{11}$ Ω·cm, further preferably higher than or equal to $1\times10^{12}$ Ω·cm. Note that the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of the transistor or the like. By using a transistor which includes an oxide semiconductor film disclosed in this specification, it is enough to provide a storage capacitor having a capacitance that is ⅓ or less, preferably ⅕ or less of liquid crystal capacitance of each pixel.

In the transistor 4040 which includes an oxide semiconductor film disclosed in this specification, the current in an off state (off-state current) can be controlled to be small. Accordingly, an electric signal such as an image signal can be held for a longer period, and a writing interval can be set longer in an on state. As a result, frequency of refresh operation can be reduced, which leads to an effect of suppressing power consumption.

The transistor 4011 which includes an oxide semiconductor film disclosed in this specification can be controlled to have high field-effect mobility and thus, high-speed operation of the scanning line driver circuit 4004 can be achieved. According to this embodiment, a switching transistor in a pixel portion and a driver transistor in a driver circuit portion can be formed over one substrate. That is, since a semiconductor device formed using a silicon wafer or the like is not additionally needed for a driver circuit, the number of components of the semiconductor device can be reduced.

In addition, a transistor including the same stack of oxide semiconductor layers as the transistor 4011 may be used for a pixel portion. By using a transistor which can operate at high speed in the pixel portion, a high-quality image or a large-sized display can also be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that one embodiment of the invention disclosed herein is not limited to the application to a display device for color display; one embodiment of the invention disclosed herein can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as organic EL element, and the latter is referred to as inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, this light-emitting element is referred to as current-excitation light-emitting element. Note that an example of an organic EL element as a light-emitting element is described here.

In order to extract light emitted from the light-emitting element, at least one of the pair of electrodes has a light-transmitting property. A transistor and a light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side, and a light-emitting element having any of these emission structures can be used.

An example of a light-emitting device in which a light-emitting element is used as a display element is illustrated in FIG. 5B. A light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031, which is illustrated. The structure of the light-emitting element 4513 can be changed as appropriate depending on the direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using either a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed.

A layer containing organic compounds may be formed to cover the light-emitting element 4513 by an evaporation method, so that oxygen, hydrogen, moisture, carbon dioxide, and the like cannot intrude into the light-emitting element 4513.

In addition, in a space which is formed with the first substrate 4001, the second substrate 4006, and the sealant 4005, a filler 4514 is provided for sealing. In this manner, the light-emitting element 4513 and the like are preferably packaged (sealed) with a protective film (such as a laminate film or an ultraviolet curable resin film) or a cover material with high air-tightness and little degasification so that the light-emitting element 4513 and the like are not exposed to the outside air.

As the filler 4514, an ultraviolet curable resin or a thermosetting resin can be used as well as an inert gas such as nitrogen or argon. For example, a polyvinyl chloride (PVC) resin, an acrylic resin, a polyimide resin, an epoxy resin, a silicone resin, a polyvinyl butyral (PVB) resin, or an ethylene vinyl acetate (EVA) resin can be used. For example, nitrogen is used as the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, electronic paper in which electronic ink is driven can be provided as the display device. The electronic paper is also referred to as electrophoretic display device (electrophoretic display), is advantageous in that it has the same level of readability as plain paper, has lower power consumption than other display devices, and can be made thin and lightweight.

An electrophoretic display device can have various modes. An electrophoretic display device contains a plurality of microcapsules dispersed in a solvent or a solute, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain a pigment and do not move without an electric field. Moreover, the first particles and the second particles have different colors (which may be colorless).

Thus, an electrophoretic display device is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed using a single material selected from a conductive material, an insulating material, a semiconductor material, a magnetic material, a liquid crystal material, a ferroelectric material, an electroluminescent material, an electrochromic material, and a magnetophoretic material, or formed using a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control the orientation of the spherical particles, so that display is performed.

Note that in FIGS. 4A to 4C and FIGS. 5A and 5B, a flexible substrate as well as a glass substrate can be used as the first substrate 4001 and the second substrate 4006. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is interposed between PVF films or polyester films can be used.

In this embodiment, an aluminum oxide film is used as the insulating film 4020.

The aluminum oxide film provided as the insulating film 4020 over the oxide semiconductor film has a high blocking effect and thus is less likely to transmit both oxygen and impurities such as hydrogen or moisture.

Therefore, in and after the manufacturing process, the aluminum oxide film functions as a protective film for preventing impurities (e.g., hydrogen or moisture) which can cause a change from entering into the oxide semiconductor film and preventing oxygen which is a main component material of the oxide semiconductor from being released from the oxide semiconductor film.

Further, the insulating film 4021 functioning as a planarization insulating film can be formed using an organic material having heat resistance, such as an acrylic resin, a polyimide resin, a benzocyclobutene-based resin, a polyamide resin, or an epoxy resin. Other than such organic materials, it is also possible to use a low-dielectric constant material (low-k material), a siloxane-based resin, phosphosilicate glass (PSG), borophosphosilicate glass (BPSG), or the like. Alternatively, the insulating film 4021 may be formed by stacking a plurality of insulating films formed using any of these materials.

The first electrode layer and the second electrode layer (each of which may be called pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (referred to as ITO), indium zinc oxide, indium tin oxide to which silicon oxide is added, or graphene.

The first electrode layer 4030 and the second electrode layer 4031 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

Since the transistor is easily broken owing to static electricity or the like, a protection circuit for protecting the driver circuit is preferably provided. The protection circuit is preferably formed using a nonlinear element.

By using the transistor described in Embodiment 1 or 2 as described above, the semiconductor device can have a variety of functions.

Embodiment 4

A semiconductor device having an image sensor function of reading information on an object can be formed with the use of the transistor described in Embodiment 1 or 2.

Figure 6A:
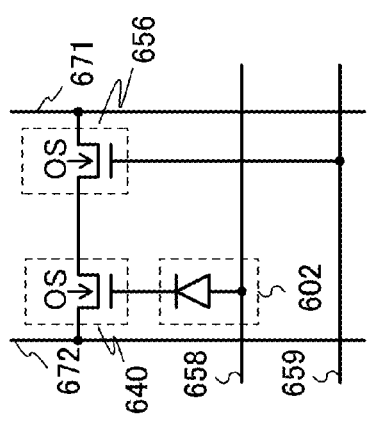
FIG. 6A is a circuit configuration of a mode of a semiconductor device and FIG. 6B is a cross-sectional view thereof.

An example of a semiconductor device having an image sensor function is illustrated in FIG. 6A. FIG. 6A illustrates an equivalent circuit of a photo sensor, and FIG. 6B is a cross-sectional view illustrating part of the photo sensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photo sensor reference signal line 672, and the other of the source and the drain of the transistor 640 is electrically connected to one of a source and a drain of a transistor 656. A gate of the transistor 656 is electrically connected to a gate signal line 659, and the other of the source and the drain of the transistor 656 is electrically connected to a photo sensor output signal line 671.

Note that in circuit diagrams in this specification, a transistor formed using an oxide semiconductor film is denoted by a symbol "OS" so that it can be identified as a transistor formed using an oxide semiconductor film. In FIG. 6A, the transistor 640 and the transistor 656 are each a transistor formed using a stack of oxide semiconductor films, as the transistor described in Embodiment 1 or 2. In this embodiment, an example in which a transistor having a structure similar to that of the transistor described in Embodiment 1 is used is described.

Figure 6B:
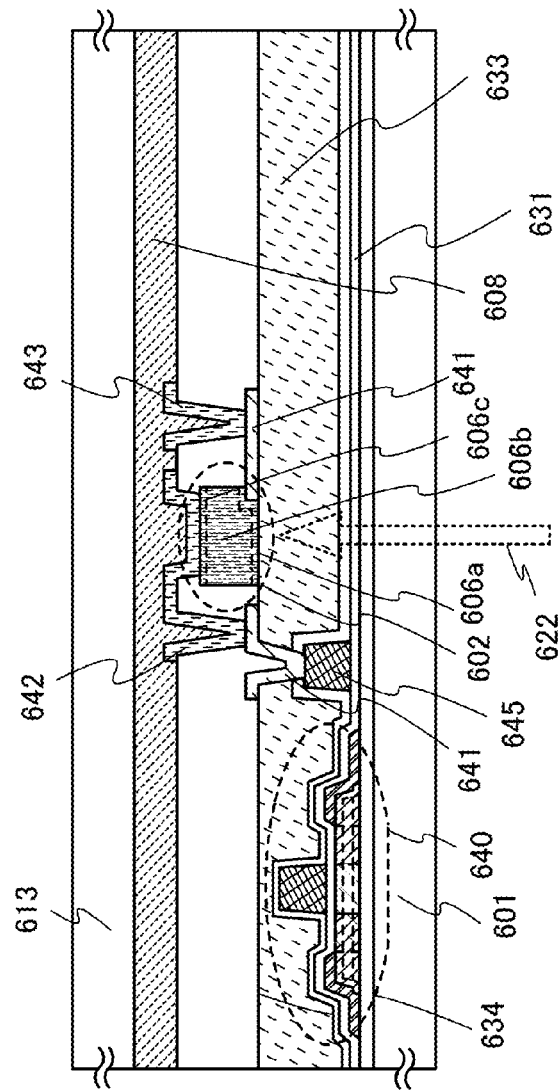

FIG. 6B is a cross-sectional view of the photodiode 602 and the transistor 640 in the photo sensor. The photodiode 602 functioning as a sensor and the transistor 640 are provided over a substrate 601 (TFT substrate) having an insulating surface. A substrate 613 is provided over the photodiode 602 and the transistor 640 with the use of an adhesive layer 608.

An insulating film 631, an insulating film 632, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are sequentially stacked from the interlayer insulating film 633 side between an electrode layer 641 formed over the interlayer insulating film 633 and an electrode layer 642 formed over the interlayer insulating film 634.

The electrode layer 641 is electrically connected to a conductive layer 643 formed over the interlayer insulating film 634, and the electrode layer 642 is electrically connected to a conductive layer 645 through the electrode layer 641. The conductive layer 645 is electrically connected to a gate electrode layer of the transistor 640, and the photodiode 602 is electrically connected to the transistor 640.

Here, a pin photodiode in which a semiconductor film having p-type conductivity type as the first semiconductor film 606a, a high-resistance semiconductor film (i-type semiconductor film) as the second semiconductor film 606b, and a semiconductor film having n-type conductivity type as the third semiconductor film 606c are stacked is illustrated as an example.

The first semiconductor film 606a is a p-type semiconductor film and can be formed using an amorphous silicon film containing an impurity element imparting p-type conductivity type. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The first semiconductor film 606a is preferably formed with a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed with a thickness greater than or equal to 200 nm and less than or equal to 1000 nm.

The third semiconductor film 606c is an n-type semiconductor film and is formed using an amorphous silicon film containing an impurity element imparting n-type conductivity type. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The third semiconductor film 606c is preferably formed with a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

In addition, the mobility of holes generated by a photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having a conductivity type opposite to that of the semiconductor film on the light-receiving plane is disturbance light; therefore, the electrode layer is preferably formed using a light-blocking conductive film. Note that a surface on the n-type semiconductor film side can alternatively be used as the light-receiving plane.

With the use of an insulating material, the insulating film 632, the interlayer insulating film 633, and the interlayer insulating film 634 can be formed, depending on the material, using a method or a tool (equipment) such as a sputtering method, a plasma CVD method, an SOG method, spin coating, dipping, spray coating, a droplet discharge method (such as an inkjet method), a printing method (such as screen printing or offset printing), a doctor knife, a roll coater, a curtain coater, or a knife coater.

In this embodiment, an aluminum oxide film is used as the insulating film 631. The insulating film 631 can be formed by a sputtering method or a plasma CVD method.

The aluminum oxide film provided as the insulating film 631 over the oxide semiconductor film has a high blocking effect and thus is less likely to transmit both oxygen and an impurity such as hydrogen or moisture.

Therefore, in and after the manufacturing process, the aluminum oxide film functions as a protective film for preventing an impurity (e.g., hydrogen or moisture) which can cause a change from entering into the oxide semiconductor film and preventing oxygen which is a main component material of the oxide semiconductor from being released from the oxide semiconductor film.

The insulating film 632 can be formed using an inorganic insulating material and can have a single-layer structure or a stacked-layer structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, or an aluminum nitride oxide layer.

For a reduction in surface roughness, an insulating film functioning as a planarization insulating film is preferably used as each of the interlayer insulating films 633 and 634. For the interlayer insulating films 633 and 634, for example, an organic insulating material having heat resistance such as a polyimide resin, an acrylic resin, a benzocyclobutene-based resin, a polyamide resin, or an epoxy resin can be used. Other than such organic insulating materials, it is possible to use a single layer or a stacked layer of a low-dielectric constant material (low-k material), a siloxane-based resin, phosphosilicate glass (PSG), borophosphosilicate glass (BPSG), or the like.

With detection of light that enters the photodiode 602, information on an object to be detected can be read. Note that a light source such as a backlight can be used at the time of reading information on the object to be detected.

As described above, a stack of oxide semiconductor layers including a buried channel is used, so that the electric characteristics of the transistor can be accurately controlled, and desirable electric characteristics can be given to the transistor. Thus, by using the transistor, a semiconductor device which can achieve a variety of purposes such as high performance, high reliability, or low power consumption can be provided.

This embodiment can be implemented in appropriate combination with any of the structures described in the other embodiments.

Embodiment 5

A semiconductor device disclosed in this specification can be applied to a variety of electric devices (including game machines). Examples of electronic devices that can be applied to the present invention include a television set (also referred to as television or television receiver), a monitor of a computer, cameras (e.g., a digital camera or a digital video camera), a digital photo frame, a mobile phone, a portable game machine, a portable information terminal, an audio reproducing device, a game machine (e.g., a pachinko machine or a slot machine), a housing of a game machine, and the like. Some specific examples of these electronic devices are illustrated in FIGS. 7A to 7D.

Figure 7A:
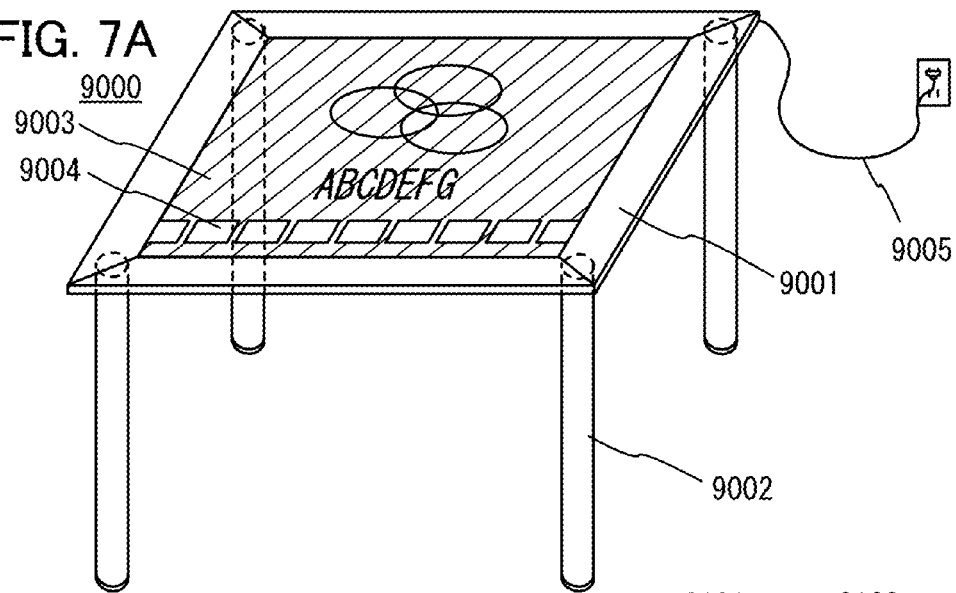
FIGS. 7A to 7D are diagrams each illustrating an electronic device.

FIG. 7A illustrates a table 9000 having a display portion. In the table 9000, a display portion 9003 is incorporated into a housing 9001. A semiconductor device manufactured according to an embodiment of the present invention can be used for the display portion 9003, and an image can be displayed on the display portion 9003. Note that the housing 9001 is supported by four leg portions 9002. Further, a power cord 9005 for supplying power is provided for the housing 9001.

The display portion 9003 has a touch input function. When a display button 9004 displayed on the display portion 9003 of the table 9000 is touched by a finger or the like, a screen can be operated or data can be input. Further, when communication with or control of another home appliance is possible, the display portion 9003 may function as a control device for controlling the home appliance with operation screen. For example, when a semiconductor device having an image sensor function described in Embodiment 3 is used, the display portion 9003 can have a touch input function.

Further, the screen of the display portion 9003 can be placed perpendicular to a floor with a hinge provided for the housing 9001; thus, the display portion 9003 can also be used as a television device. When a television device having a large screen is set in a small room, an open space is reduced; however, when a display portion is incorporated in a table, a space in the room can be efficiently used.

Figure 7B:
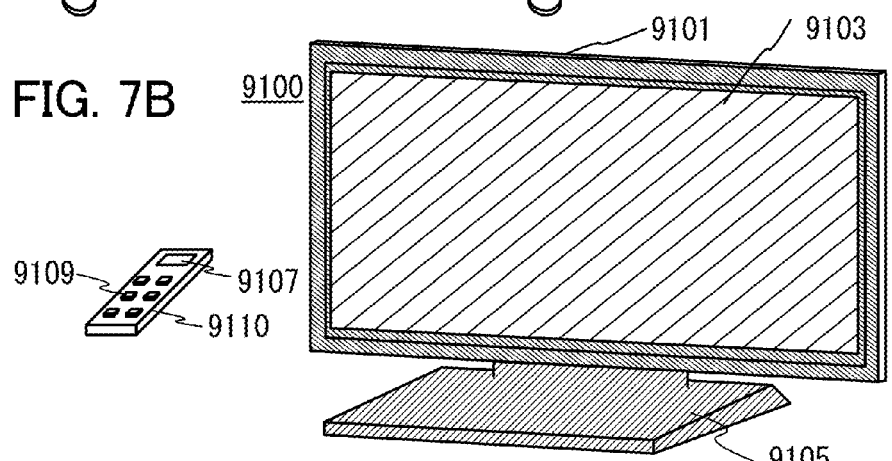

FIG. 7B illustrates a television set 9100. In the television set 9100, a display portion 9103 is incorporated in a housing 9101. A semiconductor device manufactured using one embodiment of the present invention can be used in the display portion 9103, so that an image can be displayed on the display portion 9103. Note that the housing 9101 is supported by a stand 9105 here.

The television set 9100 can be operated with an operation switch of the housing 9101 or a separate remote controller 9110. Channels and volume can be controlled with operation keys 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 7B is provided with a receiver, a modem, and the like. With the receiver, the television set 9100 can receive a general television broadcast. Further, when the television set 9100 is connected to a communication network by wired or wireless connection via the modem, one-way (from a transmitter to a receiver) or two-way (between a transmitter and a receiver or between receivers) data communication can be performed.

When the semiconductor device including a buried channel described in the above embodiments is used for the display portion 9103 including the semiconductor device in the television set, an image quality can be improved as compared with conventional images.

Figure 7C:
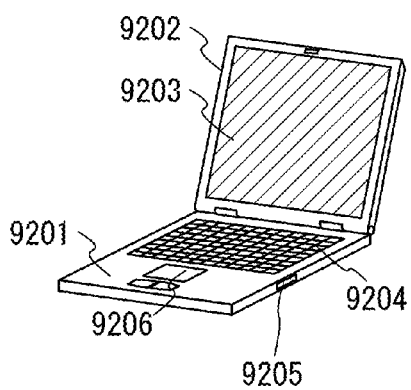

FIG. 7C illustrates a computer including a main body 9201, a housing 9202, a display portion 9203, a keyboard 9204, an external connection port 9205, a pointing device 9206, and the like. The computer is manufactured using a semiconductor device manufactured using one embodiment of the present invention for the display portion 9203.

When the semiconductor device described in the above embodiments is used for the display portion 9203 including the semiconductor device in the computer, an image quality can be improved as compared with conventional images.

Figure 7D:
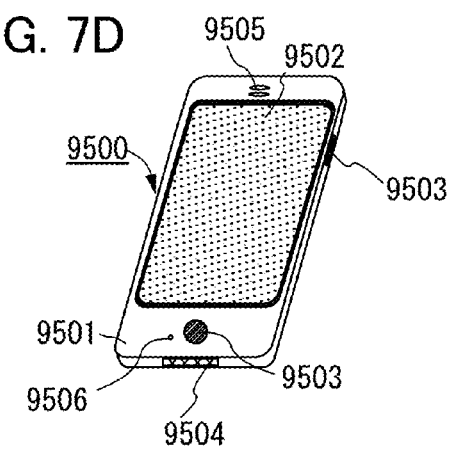

FIG. 7D illustrates an example of a mobile phone. A mobile phone 9500 is provided with a display portion 9502 incorporated in a housing 9501, operation buttons 9503, an external connection port 9504, a speaker 9505, a microphone 9506, and the like. Note that the mobile phone 9500 is manufactured using a semiconductor device manufactured using one embodiment of the present invention for the display portion 9502.

Users can input data, make a call, or text a message by touching the display portion 9502 of the mobile phone 9500 illustrated in FIG. 7D with their fingers or the like.

There are mainly three screen modes for the display portion 9502. The first mode is a display mode mainly for displaying images. The second mode is an input mode mainly for inputting data such as text. The third mode is a mode in which two modes of the display mode and the input mode are combined.

For example, in the case of making a call or texting a message, a text input mode mainly for inputting text is selected for the display portion 9502 so that characters displayed on a screen can be input. In this case, it is preferable to display a keyboard or number buttons on almost the entire screen of the display portion 9502.

By providing a detection device which includes a sensor for detecting inclination, such as a gyroscope or an acceleration sensor, inside the mobile phone 9500, the direction of the mobile phone 9500 (whether the mobile phone 9500 is placed horizontally or vertically for a landscape mode or a portrait mode) is determined so that display on the screen of the display portion 9502 can be automatically switched.

In addition, the screen mode is switched by touching the display portion 9502 or operating the operation buttons 9503 of the housing 9501. Alternatively, the screen mode can be switched depending on kinds of images displayed on the display portion 9502. For example, when a signal of an image displayed on the display portion is a signal of moving image data, the screen mode is switched to the display mode.

When the signal is a signal of text data, the screen mode is switched to the input mode.

Furthermore, in the input mode, when input by touching the display portion 9502 is not performed for a certain period while a signal is detected by the optical sensor in the display portion 9502, the screen mode may be controlled so as to be switched from the input mode to the display mode.

The display portion 9502 can also function as an image sensor. For example, an image of a palm print, a fingerprint, or the like is taken by touching the display portion 9502 with the palm or the finger, whereby personal authentication can be performed. Further, by providing a backlight or a sensing light source which emits a near-infrared light in the display portion, an image of a finger vein, a palm vein, or the like can be taken.

The semiconductor device described in the above embodiments is employed, whereby color mixing, color shift, or the like in display does not easily occur; therefore, when the semiconductor device is used for the display portion 9502 of the mobile phone, the mobile phone can have display quality higher than a conventional mobile phone.

The methods and structures described in this embodiment can be combined as appropriate with any of the methods and structures described in the other embodiments.

Example 1

In this example, a sample 1 including a first oxide semiconductor layer, a second oxide semiconductor layer which has a smaller energy gap than the first oxide semiconductor layer and is formed over the first oxide semiconductor layer, and a third oxide semiconductor layer which is formed over the second oxide semiconductor layer was formed. Ionization potential of the sample 1 was measured and calculation was performed based on the result, so that the energy band diagram was made. In this specification, the value of the ionization potential corresponds to the sum of the band gap value and the electron affinity, and the value obtained by measuring a single layer of a material with an ellipsometer can be used as the value of the band gap.

A 5-nm-thick IGZO film, a 5-nm-thick In—Sn—Zn-based oxide film, and a 5-nm-thick IGZO film were stacked over a single crystal silicon substrate as the sample 1. These films were deposited by a sputtering method at a substrate temperature of 300° C. in an oxygen atmosphere (the proportion of oxygen is 100%). An oxide target having a composition ratio of In:Ga:Zn=1:1:1 [atomic ratio] was used as the target to deposit the IGZO film. Further, an oxide target having a composition ratio of In:Sn:Zn=2:1:3 [atomic ratio] was used for the In—Sn—Zn-based oxide film.

Figure 10A:
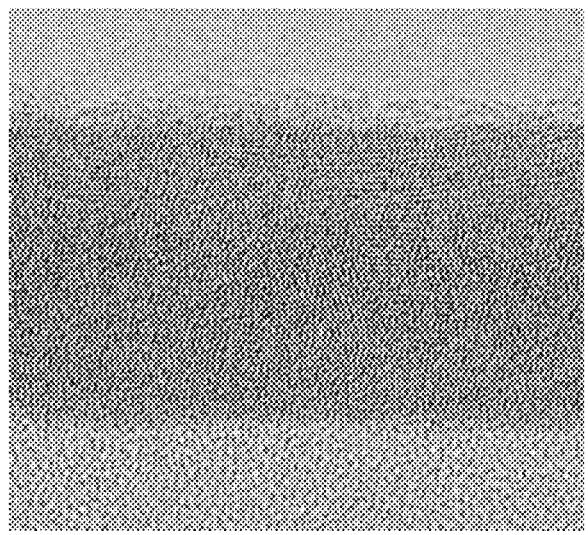
FIG. 10A is a TEM image of a sample 2 and FIG. 10B is a schematic view thereof.
Figure 10B:
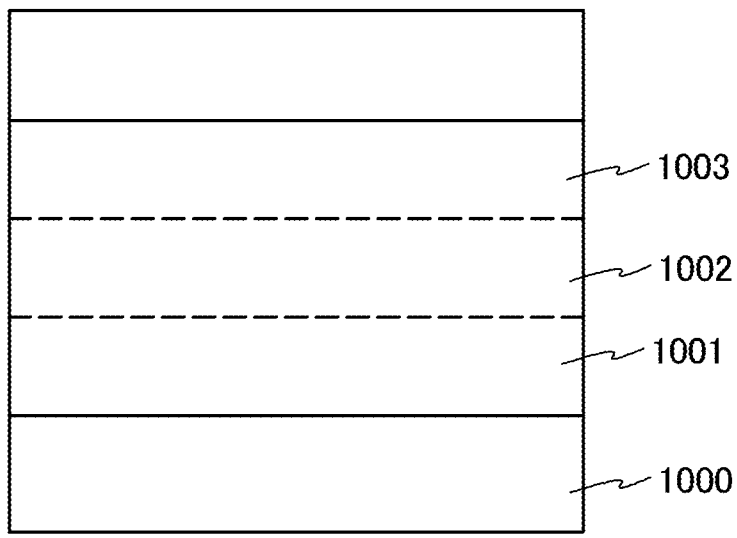

FIG. 10A is a TEM image of a cross-section of the sample 2 obtained by depositing a plurality of layers with the same deposition condition over a quartz substrate. Note that a schematic view thereof is illustrated in FIG. 10B. In FIG. 10B, interfaces between the oxide semiconductor layers are schematically denoted by a dotted line. In some cases, the interfaces between the oxide semiconductor layers are unclear depending on the material, the formation condition, or the heat treatment. In the photographed sample 2 in FIG. 10A, a 5-nm-thick first IGZO film, a 5-nm-thick In—Sn—Zn-based oxide film, and a 5-nm-thick second IGZO film are stacked over a quartz substrate 1000, and the interfaces between the IGZO films and the In—Sn—Zn-based oxide film can be observed. Further, in FIG. 10A, it can be observed that a second IGZO film 1003 and an In—Sn—Zn-based oxide film 1002 include crystals and are each a c-axis aligned crystalline oxide semiconductor (CAAC-OS).

Further, a first IGZO film 1001 includes crystals, and the interface between the first IGZO film 1001 and the quartz substrate 1000 has an amorphous structure. Note that in FIG. 10A, all of the three layers of the oxide semiconductor films have crystalline structures; however, films included in the sample 2 are not limited thereto. Only the second IGZO film 1003 may have a crystalline structure, two out of the three layers may have crystalline structures, or all of the three layers may have amorphous structures.

Figure 8:
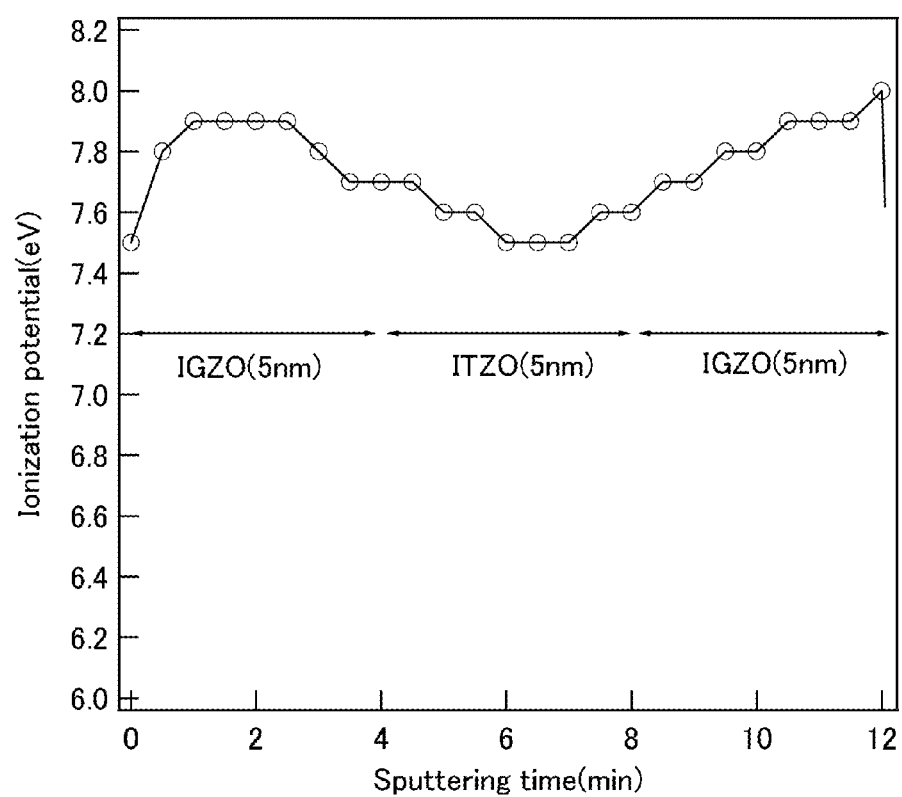
FIG. 8 is a diagram illustrating ionization potential.

The result of the ionization potential measured by ultraviolet photoelectron spectroscopy (UPS) during sputtering from the surface of the sample 1 is shown in FIG. 8.

In FIG. 8, the horizontal axis indicates the time for sputtering from the surface of the sample 1 and the vertical axis indicates the ionization potential. Borders between the films are made on the assumption that the sputtering rate of the IGZO film is equal to that of the In—Sn—Zn-based oxide film. From FIG. 8, the ionization potential is lowered when the In—Sn—Zn-based oxide film which was sandwiched between the IGZO films is sputtered. Note that ionization potential corresponds to energy difference between a vacuum level and valence band.

Figure 9:
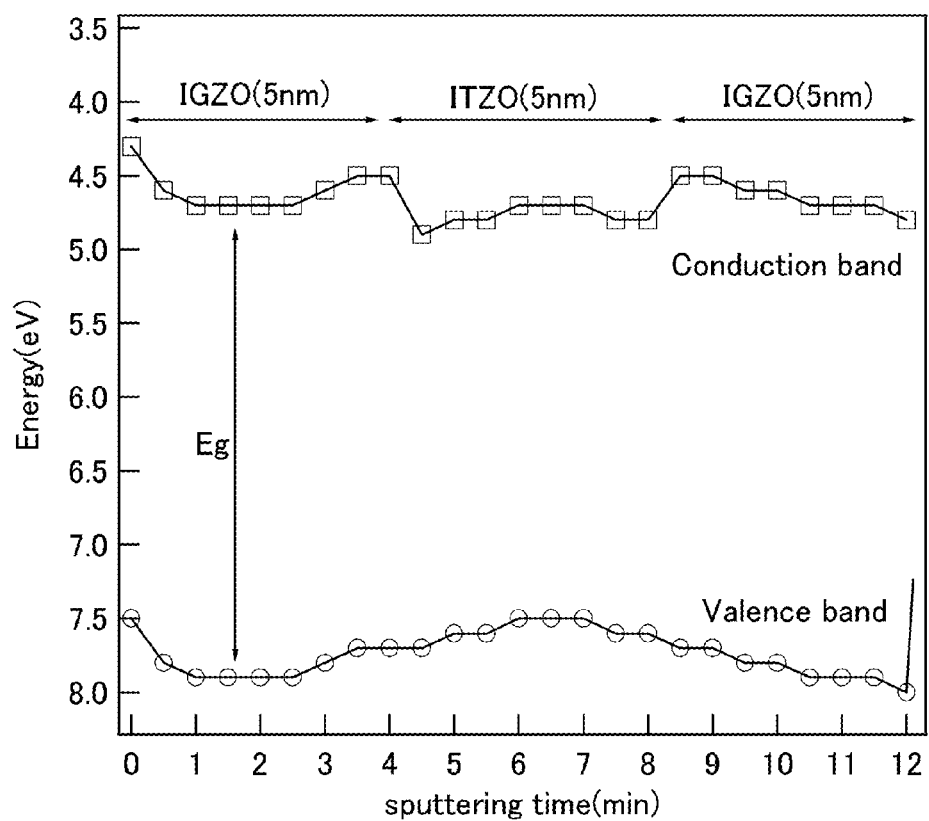
FIG. 9 is an energy band diagram.

The energy of the conduction band was obtained by subtracting the band gap measured with an ellipsometer from the value of the ionization potential, and the band structure of the stacked films was formed. Note that the IGZO film had a band gap of 3.2 eV, and the In—Sn—Zn-based oxide film had a band gap of 2.8 eV. FIG. 9 shows the result. As seen from FIG. 9, it can be observed that a buried channel is formed as in an energy band diagram shown in FIG. 1D.

In this example, as a stacked layer, IGZO films were used for the first oxide semiconductor layer and the third oxide semiconductor layer, and an In—Sn—Zn-based oxide film was used for the second oxide semiconductor layer having higher ionization potential and a smaller energy gap than the first oxide semiconductor layer and the third oxide semiconductor layer. An energy band diagram of the stacked layer corresponds to FIG. 9 or FIG. 1D. The combination of materials of the first oxide semiconductor layer, the second oxide semiconductor layer, and the third oxide semiconductor layer were not particularly limited, and in consideration of energy gaps of the materials to be used, the materials may be appropriately selected and combined by practitioners in order to satisfy the energy band diagram shown in FIG. 9 or FIG. 1D. For example, a structure in which IGSO films are used for the first oxide semiconductor layer and the third oxide semiconductor layer, and an In—Zn-based oxide film (In—Zn—O film) is used for the second oxide semiconductor layer may be used.

This application is based on Japanese Patent Application serial No. 2011-135561 filed with Japan Patent Office on Jun. 17, 2011, the entire contents of which are hereby incorporated by reference.

What is claimed is:

1. A semiconductor device comprising:
   a first oxide semiconductor layer on an oxide insulating film;
   a second oxide semiconductor layer over the first oxide semiconductor layer;
   a third oxide semiconductor layer over the second oxide semiconductor layer, wherein the third oxide semiconductor layer is in contact with side surfaces of the second oxide semiconductor layer and a first region of the first oxide semiconductor layer;

a gate insulating film over the third oxide semiconductor layer; and a gate electrode layer over the third oxide semiconductor layer with the gate insulating film therebetween, wherein the second oxide semiconductor layer has a smaller energy gap than the first oxide semiconductor layer and the third oxide semiconductor layer, and wherein the first region of the oxide insulating film which contacts the third oxide semiconductor layer is thinner than a second region of the oxide insulating film which is just below the first oxide semiconductor layer.

2. The semiconductor device according to claim 1, wherein the third oxide semiconductor layer is in contact with side surfaces of the first oxide semiconductor layer.

3. The semiconductor device according to claim 1, wherein the oxide insulating film comprises silicon oxide.

4. The semiconductor device according to claim 1, wherein the second oxide semiconductor layer has greater electron affinity than the first oxide semiconductor layer and the third oxide semiconductor layer.

5. The semiconductor device according to claim 1, wherein the second oxide semiconductor layer comprises In—Sn—Zn-based oxide.

6. The semiconductor device according to claim 1, wherein the third oxide semiconductor layer comprises crystals of which c-axes are aligned substantially in one direction.

7. The semiconductor device according to claim 1, wherein the second oxide semiconductor layer has a hydrogen concentration lower than or equal to $5\times10^{19}/cm^3$.

8. The semiconductor device according to claim 1, wherein the third oxide semiconductor layer comprises In, Ga, Zn and O.

9. The semiconductor device according to claim 1, further comprising a source electrode layer and a drain electrode layer over and in contact with the third oxide semiconductor layer.

10. A semiconductor device comprising:
a first oxide semiconductor layer on an oxide insulating film;
a second oxide semiconductor layer over the first oxide semiconductor layer;
a third oxide semiconductor layer over the second oxide semiconductor layer, wherein the third oxide semiconductor layer is in contact with side surfaces of the second oxide semiconductor layer and a first region of the first oxide semiconductor layer;
a gate insulating film over the third oxide semiconductor layer; and
a gate electrode layer over the third oxide semiconductor layer with the gate insulating film therebetween, the gate electrode layer comprising an oxide of at least indium,
wherein the second oxide semiconductor layer has a smaller energy gap than the first oxide semiconductor layer and the third oxide semiconductor layer, and wherein the first region of the oxide insulating film which contacts the third oxide semiconductor layer is thinner than a second region of the oxide insulating film which is just below the first oxide semiconductor layer.

11. The semiconductor device according to claim 10, wherein the third oxide semiconductor layer is in contact with side surfaces of the first oxide semiconductor layer.

12. The semiconductor device according to claim 10, wherein the oxide insulating film comprises silicon oxide.

13. The semiconductor device according to claim 10, wherein the second oxide semiconductor layer has greater electron affinity than the first oxide semiconductor layer and the third oxide semiconductor layer.

14. The semiconductor device according to claim 10, wherein the second oxide semiconductor layer comprises In—Sn—Zn-based oxide.

15. The semiconductor device according to claim 10, wherein the third oxide semiconductor layer comprises crystals of which c-axes are aligned substantially in one direction.

16. The semiconductor device according to claim 10, wherein the second oxide semiconductor layer has a hydrogen concentration lower than or equal to $5\times10^{19}/cm^3$.

17. The semiconductor device according to claim 10, wherein the third oxide semiconductor layer comprises In, Ga, Zn and O.

18. The semiconductor device according to claim 10, further comprising a source electrode layer and a drain electrode layer over and in contact with the third oxide semiconductor layer.

19. A semiconductor device comprising:
a first oxide semiconductor layer on an oxide insulating film;
a second oxide semiconductor layer over the first oxide semiconductor layer wherein the second oxide semiconductor layer comprises a pair of dopant introduced regions with a channel formation region therebetween;
a third oxide semiconductor layer over the second oxide semiconductor layer, wherein the third oxide semiconductor layer is in contact with side surfaces of the second oxide semiconductor layer and a first region of the first oxide semiconductor layer;
a gate insulating film over the third oxide semiconductor layer; and
a gate electrode layer over the third oxide semiconductor layer with the gate insulating film therebetween,
wherein the second oxide semiconductor layer has a smaller energy gap than the first oxide semiconductor layer and the third oxide semiconductor layer, and
wherein the first region of the oxide insulating film which contacts the third oxide semiconductor layer is thinner than a second region of the oxide insulating film which is just below the first oxide semiconductor layer.

20. The semiconductor device according to claim 19, wherein the pair of dopant introduced regions are doped with a dopant with a gate electrode used as a mask.

* * * * *